(12) United States Patent
Lin et al.

(10) Patent No.: US 11,704,469 B2
(45) Date of Patent: Jul. 18, 2023

(54) INTEGRATED CIRCUIT AND METHOD OF FORMING THE SAME

(71) Applicant: TAIWAN SEMICONDUCTOR MANUFACTURING COMPANY, LTD., Hsinchu (TW)

(72) Inventors: John Lin, Hsinchu (TW); Chin-Shen Lin, Hsinchu (TW); Kuo-Nan Yang, Hsinchu (TW); Chung-Hsing Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/325,787

(22) Filed: May 20, 2021

(65) Prior Publication Data
US 2021/0271799 A1 Sep. 2, 2021

Related U.S. Application Data

(62) Division of application No. 16/460,439, filed on Jul. 2, 2019, now Pat. No. 11,017,146.

(Continued)

(51) Int. Cl.
*G06F 30/39* (2020.01)
*G06F 30/398* (2020.01)
(Continued)

(52) U.S. Cl.
CPC .............. *G06F 30/398* (2020.01); *G03F 1/36* (2013.01); *G03F 1/70* (2013.01); *G03F 1/82* (2013.01)

(58) Field of Classification Search
CPC . G06F 30/398; G03F 1/36; G03F 1/70; G03F 1/82; H01L 21/8221;
(Continued)

(56) References Cited

U.S. PATENT DOCUMENTS

| 7,260,442 B2 | 8/2007 | Hwang et al. |
| 8,648,654 B1 | 2/2014 | Myers et al. |

(Continued)

FOREIGN PATENT DOCUMENTS

| CN | 105826283 | 8/2016 |
| JP | 2014-45009 | 3/2014 |

(Continued)

OTHER PUBLICATIONS

Office Action dated Mar. 25, 2020 from corresponding application No. TW 108124556, all pages.

(Continued)

*Primary Examiner* — Paul Dinh
(74) *Attorney, Agent, or Firm* — Hauptman Ham, LLP

(57) ABSTRACT

An integrated circuit includes a first set of devices, a set of metal layers and a header circuit. The first set of devices are configured to operate on a first supply voltage, and are located on a first layer of the integrated circuit. The set of metal layers are above the first layer, and includes a first metal layer and a second metal layer. The first metal layer extends in at least a first direction and a second direction. The header circuit is above the first set of devices. At least a portion of the header circuit is positioned between the first metal layer and the second metal layer. The header circuit is configured to provide the first supply voltage to the first set of devices, and is configured to be coupled to a first voltage supply having the first supply voltage.

20 Claims, 13 Drawing Sheets

Related U.S. Application Data

(60) Provisional application No. 62/698,491, filed on Jul. 16, 2018.

(51) Int. Cl.
  *G03F 1/82* (2012.01)
  *G03F 1/70* (2012.01)
  *G03F 1/36* (2012.01)

(58) Field of Classification Search
  CPC ............ H01L 27/0688; H01L 27/1225; H01L 29/7869; H01L 27/0617; H01L 21/823475; H01L 21/823871; H01L 23/50; H01L 23/5283; H01L 27/0207; H01L 27/0611
  USPC ........................................................ 716/100
  See application file for complete search history.

(56) References Cited

U.S. PATENT DOCUMENTS

| | | | |
|---|---|---|---|
| 9,256,709 B2 | 2/2016 | Yu et al. | |
| 2002/0042902 A1 | 4/2002 | Yamamoto et al. | |
| 2005/0091629 A1* | 4/2005 | Eisenstadt | G06F 30/327 326/81 |
| 2010/0070942 A1 | 3/2010 | Madurawe | |
| 2011/0127608 A1* | 6/2011 | Cheng | H01L 21/76251 438/157 |
| 2011/0181343 A1 | 7/2011 | Myers et al. | |
| 2011/0309353 A1* | 12/2011 | Kaneko | H01L 29/45 257/E21.477 |
| 2014/0040838 A1 | 2/2014 | Liu et al. | |
| 2014/0054584 A1 | 2/2014 | Sunamura et al. | |
| 2014/0229908 A1 | 8/2014 | Sherlekar et al. | |
| 2015/0149794 A1* | 5/2015 | Zelikson | G06F 1/26 327/434 |
| 2015/0162448 A1 | 6/2015 | Raghavan et al. | |
| 2015/0278429 A1 | 10/2015 | Chang | |
| 2015/0355662 A1 | 12/2015 | Myers et al. | |
| 2016/0219696 A1 | 7/2016 | Choi et al. | |
| 2016/0261252 A1* | 9/2016 | Agarwal | H03K 3/356008 |
| 2017/0207642 A1 | 7/2017 | Sato et al. | |
| 2017/0358562 A1 | 12/2017 | Banna et al. | |
| 2018/0024618 A1 | 1/2018 | Steudel et al. | |
| 2018/0047756 A1 | 2/2018 | Yoshida et al. | |
| 2018/0102776 A1 | 4/2018 | Chandrasekar et al. | |
| 2019/0280106 A1* | 9/2019 | Lin | H01L 21/28587 |
| 2020/0066854 A1* | 2/2020 | Nelson | H01L 29/41791 |

FOREIGN PATENT DOCUMENTS

| | | |
|---|---|---|
| KR | 10-2014-0039989 | 4/2014 |
| KR | 10-2015-0067730 | 6/2016 |

OTHER PUBLICATIONS

Office Action dated Jun. 30, 2020 from corresponding application No. KR 10-2019-0085959, pp. 1-7.
Office Action dated Jul. 20, 2021 for corresponding case No. CN 201910639715.4. (pp. 1-14).

* cited by examiner

INTEGRATED CIRCUIT AND METHOD OF FORMING THE SAME

PRIORITY CLAIM

The present application is a divisional of U.S. application Ser. No. 16/460,439 filed Jul. 2, 2019, now U.S. Pat. No. 11,017,146, issued May 25, 2021, which claims the benefit of U.S. Provisional Application No. 62/698,491, filed Jul. 16, 2018, each of which are incorporated herein by reference in their entireties.

BACKGROUND

The semiconductor integrated circuit (IC) industry has produced a wide variety of analog and digital devices to address issues in a number of different areas. As ICs have become smaller and more complex, operating voltages of these analog and digital devices are reduced affecting the operating voltages of these digital devices and overall IC performance. Furthermore, power consumption in these analog and digital devices can increase due to leakage currents. Power gating is a technique to reduce power consumption in circuits within an IC by turning off power supplied to circuits within the IC not being used.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
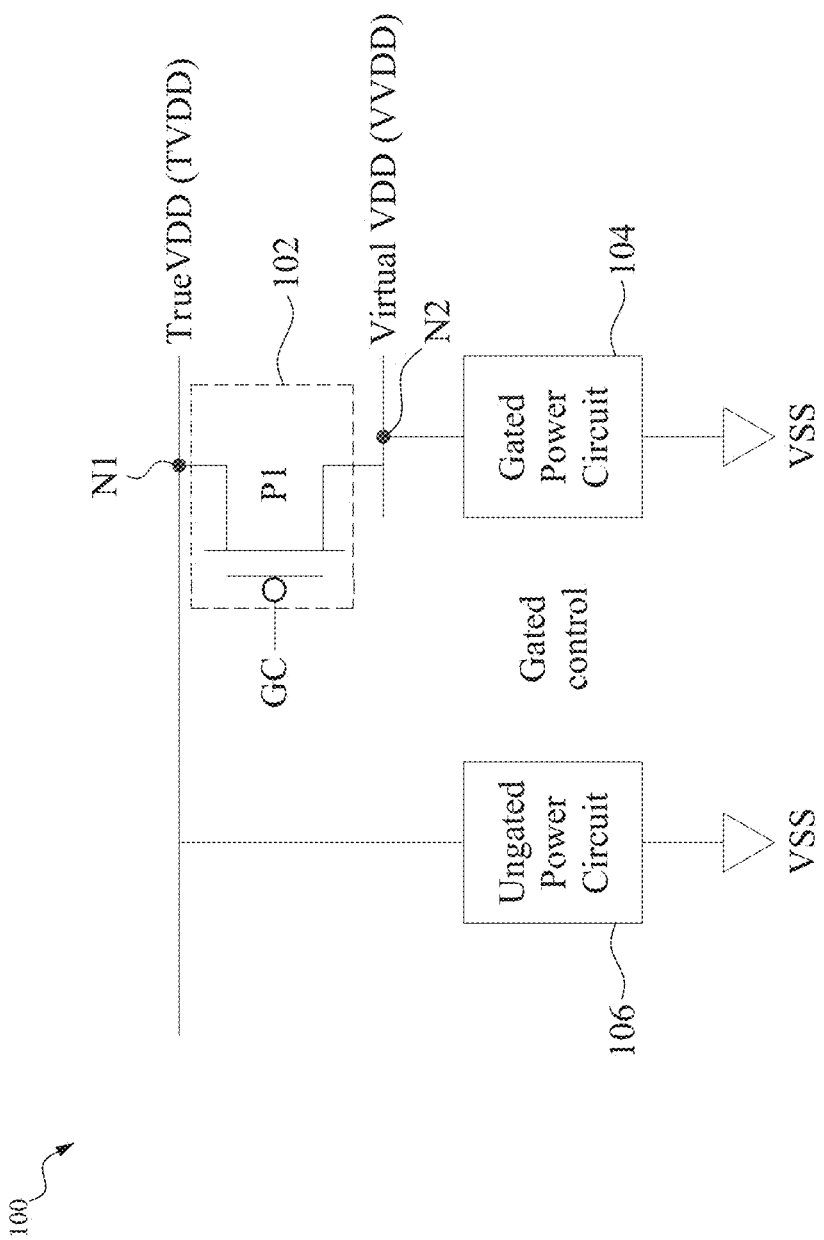
FIG. 1 is a block diagram of an integrated circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an integrated circuit includes a first set of devices located on a first layer of the integrated circuit, a set of metal layers above the first layer and a header circuit above the first set of devices. The first set of devices are configured to operate on a first supply voltage. At least a portion of the header circuit is positioned between a first metal layer of the set of metal layers and a second metal layer of the set of metal layers. The header circuit is configured to provide the first supply voltage to the first set of devices, and is coupled to a second voltage supply having a second supply voltage different from the first supply voltage.

In some embodiments, the header circuit includes a switch that is positioned between the first metal layer of the set of metal layers and the second metal layer of the set of metal layers resulting in the header circuit occupying less area than other approaches.

In some embodiments, at least a gate portion of a set of gates of the switch of the header circuit is positioned between the first metal layer of the set of metal layers and the second metal layer of the set of metal layers resulting in the header circuit to occupy less area than other approaches. In some embodiments, at least a set of conductive features are coupled to at least a drain or source of the switch in the header circuit.

In some embodiments, at least the gate portion of the set of gates extends in at least two directions (2D structure) (e.g., a first direction and a second direction). In some embodiments, the one or more sets of conductive features extends in at least two directions (2D structure). In some embodiments, by having at least a gate portion of a set of gates extend in at least 2 directions, the effective gate width of the set of gates is larger than other approaches where the gate extends in only a single direction. By having a larger effective gate width results in integrated circuit having an increase in the header density causing a greater electron mobility and therefore a higher driving current capability than other approaches.

In some embodiments, by having at least the one or more sets of conductive features extend in at least 2 directions, the effective header width of the header circuit is larger than other approaches. By having a larger effective header width results in integrated circuit having an increase in the header density causing a greater electron mobility and therefore a higher driving current capability than other approaches.

Integrated Circuit

FIG. 1 is a block diagram of an integrated circuit 100, in accordance with some embodiments.

Integrated circuit 100 includes a header circuit 102 coupled to a gated power circuit 104 and an ungated power circuit 106. Gated power circuit 104 is configured to receive a gated power (e.g., VVDD) from the header circuit 102. Ungated power circuit 106 is configured to receive an ungated power (e.g., TVDD) from a first voltage supply TVDD.

Header circuit 102 is coupled to a node N1 of the first voltage supply TVDD and a node N2. Header circuit 102 is configured to receive a first voltage from the first voltage supply TVDD. In some embodiments, the first voltage supply TVDD is a voltage supply positioned external of integrated circuit 100, and is referred to as a true VDD (TVDD). In some embodiments, the first voltage supply TVDD is a voltage supply positioned internal of integrated circuit 100.

Header circuit 102 is configured to receive a control signal GC. In some embodiments, header circuit 102 is configured to be turned on based on control signal GC. In some embodiments, header circuit 102 is configured to be turned on, and configured to provide a second voltage to the second node N2, and is referred to as a virtual voltage supply (VVDD) or a second voltage supply VVDD. In some embodiments, the first voltage of the first voltage supply TVDD is different from the second voltage of the second supply voltage VVDD. In some embodiments, the first voltage of the first voltage supply TVDD is the same as the second voltage of the second supply voltage VVDD.

Header circuit 102 is configured to provide the second voltage to at least gated power circuit 104 or node N2 responsive to the control signal GC. In some embodiments, based on different power states of the gated power circuit 104, header circuit 102 is configured to switch on and thereby provide power to the gated power circuit 104 responsive to the control signal GC, or header circuit 102 is configured to switch off and thereby cut off power provided to the gated power circuit 104 responsive to the control signal GC. For example, when gated power circuit 104 is in a sleep mode or a standby mode, header circuit 102 is configured to be turned off, and the power provided to gated power circuit 104 is thereby cut off. For example, when gated power circuit 104 is in an active mode, header circuit 102 is configured to be turned on, and thereby provides power to gated power circuit 104. In some embodiments, the control signal GC is received from a power management controller circuit (not shown). Header circuit 102 is configured to reduce leakage current within gated control circuit 104, and therefore reduce the power consumed by gated control circuit 104.

Header circuit 102 includes a P-type metal oxide semiconductor (PMOS) transistor P1. Other types of transistors or numbers of transistors in header circuit 102 are within the contemplated scope of the present disclosure. A gate terminal of PMOS transistor P1 is configured to receive the control signal GC. A source terminal of PMOS transistor P1 is coupled with node N1 of the first voltage supply TVDD. A drain terminal of PMOS transistor P1 is coupled with node N2 and gated power circuit 104. PMOS transistor P1 is configured to provide the second voltage to at least gated power circuit 104 or node N2 responsive to the control signal GC. In some embodiments, header circuit 102 is turned on or off based on the control signal GC and the first voltage of the first voltage supply TVDD.

In some embodiments, the header circuit 102 or PMOS transistor P1 is a thin film transistor (TFT). Other types of transistors or numbers of transistors in header circuit 102 are within the contemplated scope of the present disclosure. In some embodiments, header circuit 102 includes one or more diode elements or diode coupled transistors. In some embodiments, header circuit 102 includes one or more elements capable of exhibiting switching behavior or function.

Gated power circuit 104 is coupled between node N2 of the second voltage supply VVDD and a node of the supply reference voltage VSS. Gated power circuit 104 is configured to receive gated power (e.g., the second voltage supply VVDD) from header circuit 102. Gated power circuit 104 includes one or more transistors, integrated circuits, active or passive devices, or logic circuits configured to operate on the second supply voltage VVDD.

Ungated power circuit 106 is coupled between node N1 of the first voltage supply TVDD and a node of the supply reference voltage VSS. Ungated power circuit 106 is configured to receive ungated power from the first voltage supply TVDD. Ungated power circuit 106 includes one or more transistors, integrated circuits, active or passive devices, or logic circuits configured to operate on the first supply voltage TVDD.

In some embodiments, a logic circuit includes an AND, OR, NAND, NOR, XOR, INV, AND-OR-Invert (AOI), OR-AND-Invert (OAI), MUX, Flip-flop, BUFF, Latch, delay, clock cells, or the like. In some embodiments, a memory cell includes a static random access memory (SRAM), a dynamic RAM (DRAM), a resistive RAM (RRAM), a magnetoresistive RAM (MRAM) or read only memory (ROM). In some embodiments, one or more active or passive elements include, but are not limited to, transistors and diodes. In some embodiments, transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs, etc.), FinFETs, and planar MOS transistors with raised source/drain, or the like. Examples of passive elements include, but are not limited to, capacitors, inductors, fuses, and resistors.

Figure 2A:
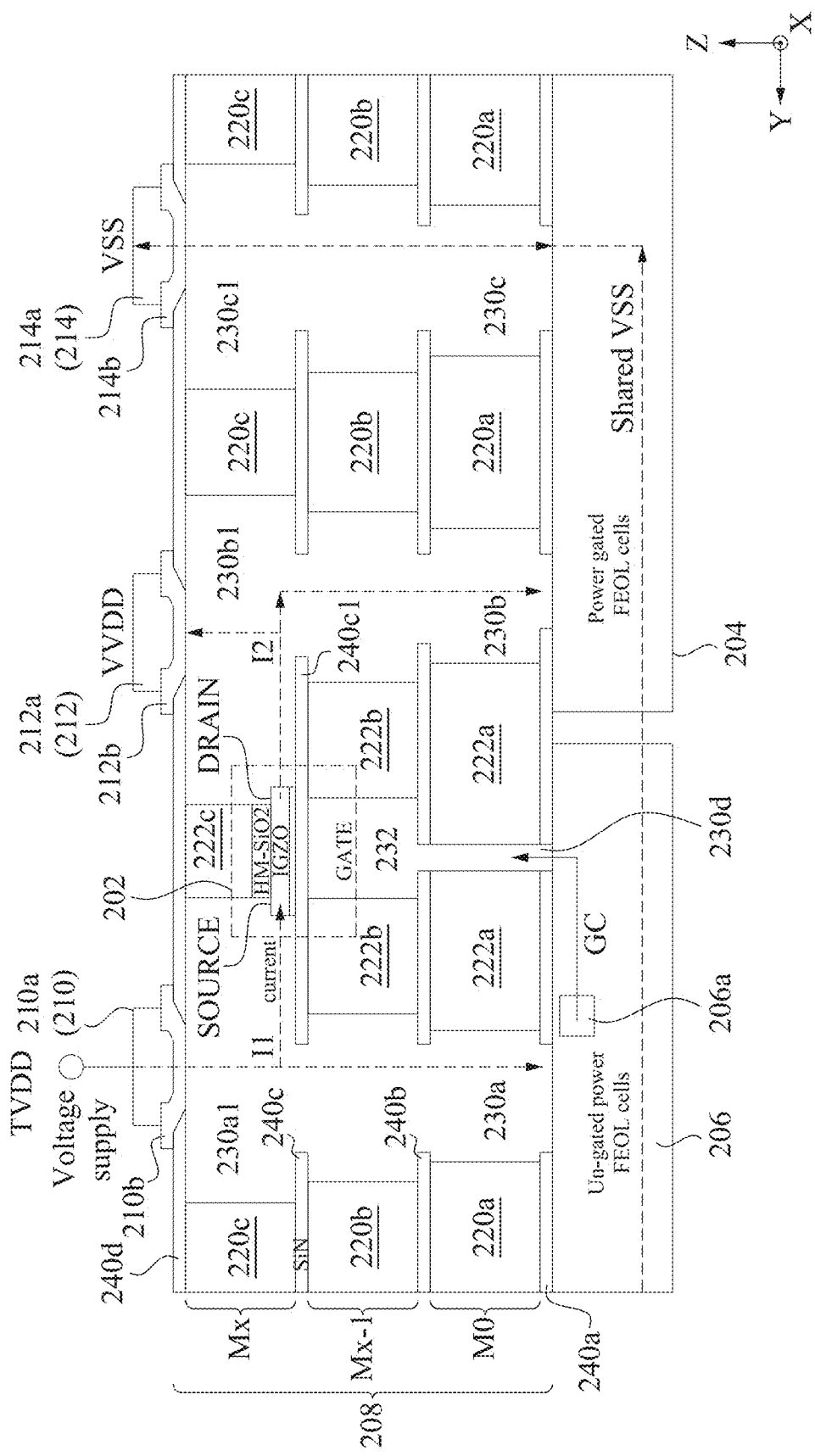
FIG. 2A is a cross-sectional view of an integrated circuit, in accordance with some embodiments.
Figure 2B:
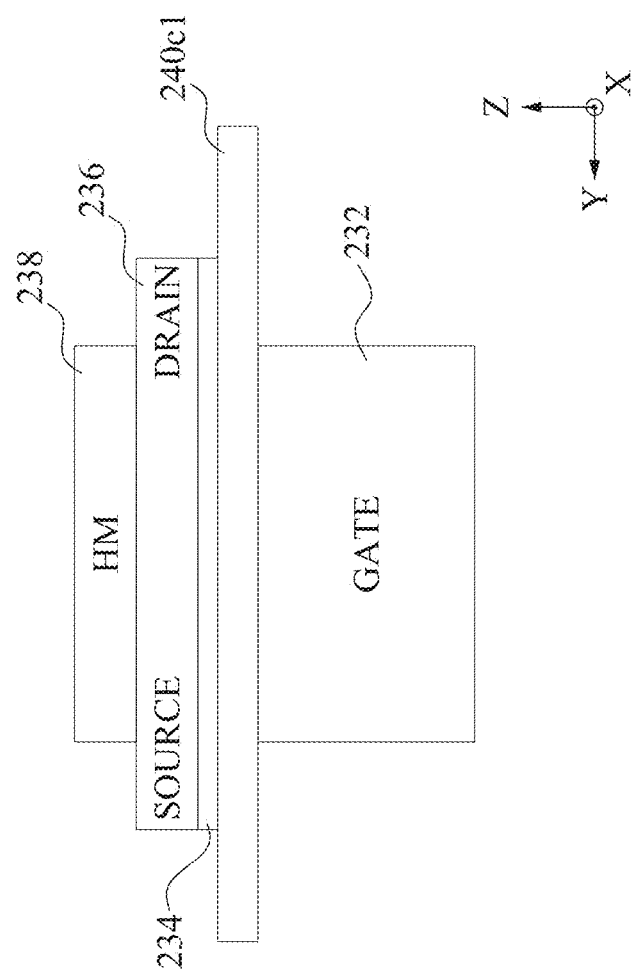
FIG. 2B is a cross-sectional view of a header circuit of an integrated circuit, in accordance with some embodiments.

FIG. 2A is a cross-sectional view of an integrated circuit 200, in accordance with some embodiments. FIG. 2B is a cross-sectional view of a header circuit 202 of integrated circuit 200, in accordance with some embodiments.

Integrated circuit 200 is an embodiment of integrated circuit 100 of FIG. 1, in accordance with some embodiments.

FIG. 2A is a cross-sectional view of integrated circuit 200 corresponding to layout design 300A (FIG. 3A) or integrated circuit 300B (FIG. 3B) as intersected by plane B-B', layout design 400A (FIG. 4A) or integrated circuit 400B (FIG. 4B) as intersected by plane C-C', or layout design 500A (FIG. 5A) or integrated circuit 500B (FIG. 5B) as intersected by plane D-D'.

Integrated circuit 200 includes a header circuit 202, a gated power circuit 204, an ungated power circuit 206, an interconnect 208, conductive structure 210, conductive structure 212 and conductive structure 214.

Header circuit 202 is similar to header circuit 102 of FIG. 1, and similar detailed description is therefore omitted. A zoomed in portion of header circuit 202 is shown in FIG. 2B.

Header circuit 202 includes a gate 232 of PMOS transistor P1 in a metal layer Mx-1 of interconnect 208. Gate 232 is similar to the gate of PMOS transistor P1 of FIG. 1, and similar detailed description is therefore omitted. In some embodiments, gate 232 is a metal gate. In some embodiments, PMOS transistor P1 is a thin-film transistor (TFT). In some embodiments, gate 232 includes one or more copper or copper alloys, and is formed using one or more single or dual damascene processes. In some embodiments, gate 232 includes one or more layers of metal materials, such as Al, Cu, W, Ti, Ta, TiN, TaN, NiSi, CoSi, other suitable conductive materials, or combinations thereof. In some embodiments, header circuit 202 is positioned between a conductive structure 210 and a conductive structure 212. Other configurations, arrangements or materials of gate 232 are within the contemplated scope of the present disclosure.

Header circuit 202 further includes a capping layer 240c1 on at least the gate 232. In some embodiments, capping layer 240c1 electrically isolates a portion of metallization layer Mx and a portion of metallization layer Mx-1. In some embodiments, a width of the capping layer 240c1 in the second direction Y is greater than a width of the gate 232 in the second direction Y. In some embodiments, capping layer 240c1 includes one or more layers of one or more insulating materials. In some embodiments, capping layer 240c1 includes one or more layers of a dielectric material that includes SiN, SiCN, the like or combinations thereof. In some embodiments, one or more layers of the dielectric material are made of a low dielectric constant (low-k) material. In some embodiments, capping layer 240c1 is also referred to as an etch stop layer (ESL). In some embodiments, capping layer 240c1 is on at least the top surface of the gate 232. In some embodiments, the capping layer 240c1 is formed using CVD, spin-on polymeric dielectric or other suitable formation processes. Other configurations, arrangements or materials of capping layer 240c1 are within the contemplated scope of the present disclosure.

Header circuit 202 further includes a gate dielectric layer 234 on capping layer 240c1. In some embodiments, a width of the gate dielectric layer 234 in the second direction Y is greater than a width of the gate 232 in the second direction Y. In some embodiments, the gate dielectric layer 234 electrically isolates the gate 232 from the source or drain regions of a semiconducting layer 236 (e.g., PMOS transistor P1). In some embodiments, the gate dielectric layer 234 includes $SiO_2$, $Al_2O_3$, the like, or combinations thereof. Other configurations, arrangements or materials of gate dielectric layer 234 are within the contemplated scope of the present disclosure.

Header circuit 202 further includes a semiconducting layer 236 on gate dielectric layer 234. In some embodiments, a first portion of the semiconducting layer 236 corresponds to a source of PMOS transistor P1, and a second portion of the semiconducting layer 236 corresponds to a drain of PMOS transistor P1. In some embodiments, the first portion is on an opposite end of the semiconducting layer 236 from the second portion of the semiconducting layer 236. In some embodiments, a width of the semiconducting layer 236 in the second direction Y is different from a width of the gate dielectric layer 234 in the second direction Y. In some embodiments, the semiconducting layer 236 includes one or more layers of semiconducting material, such as ZnO, In—Ga—Zn—O, the like or combinations thereof. Other configurations, arrangements or materials of semiconducting layer 236 are within the contemplated scope of the present disclosure.

Header circuit 202 further includes a hard mask 238 on the semiconducting layer 236. In some embodiments, the hard mask 238 protects the semiconducting layer 236 during formation of one or more metallization layers M0, . . . , Mx-1, Mx within interconnect 208. In some embodiments, a width of the hard mask 238 in the second direction Y is different from the width of the semiconducting layer 236 in the second direction Y. In some embodiments, the hard mask 238 electrically isolates portions of the source from portions of the drain of the semiconducting layer 236. In some embodiments, the hard mask 238 includes $SiO_2$, $Si_3N_4$, the like or combinations thereof. Other configurations, arrangements or materials of hard mask 238 are within the contemplated scope of the present disclosure. In some embodiments, at least a portion of the header circuit 202 extends in the first direction X and the second direction Y. In some embodiments, at least a portion of one or more of gate 232, gate dielectric layer 234, capping layer 240c1, semiconducting layer 236 or hard mask 238 extends in the first direction X and the second direction Y similar to one or more elements shown in integrated circuit 300B (FIG. 3B), integrated circuit 400B (FIG. 4B) or integrated circuit 500B (FIG. 5B). Other configurations, arrangements or materials of header circuit 202 are within the contemplated scope of the present disclosure.

Gated power circuit 204 is similar to gated power circuit 104 of FIG. 1, and similar detailed description is therefore omitted. Ungated power circuit 206 is similar to ungated power circuit 106 of FIG. 1, and similar detailed description is therefore omitted.

Gated power circuit 204 and ungated power circuit 206 are over a substrate (not shown). In some embodiments, gated power circuit 204 and ungated power circuit 206 are formed as part of a front end of line (FEOL) manufacturing process. In some embodiments, gated power circuit 204 and un-gated power circuit 206 are separated from each other in at least the second direction Y. In some embodiments, gated power circuit 204 and un-gated power circuit 206 are configured to share the reference voltage supply VSS. Other configurations and arrangements of gated power circuit 204 are within the contemplated scope of the present disclosure.

In some embodiments, ungated power circuit 206 includes a controller 206a. In some embodiments, controller 206a is configured to generate control signal GC. In some embodiments, controller 206a is configured to turn on or turn off header circuit 202 responsive to the value of the control signal GC. In some embodiments, controller 206a is a power management controller circuit. In some embodiments, additional gated power circuits similar to gated power circuit 204 and additional header circuits similar to header circuit 202 are located adjacent to ungated power circuit 206, but are not shown in FIG. 2A for simplicity. In these embodiments, controller 206a is also configured to send control signal GC to the additional header circuit, and the additional header circuit is configured to supply voltage TVDD to the additional gated power circuit. Other configurations and arrangements of ungated power circuit 206 are within the contemplated scope of the present disclosure.

Interconnect 208 is over gated power circuit 204 and ungated power circuit 206. In some embodiments, interconnect 208 is configured to provide an electrical connection between the gated power circuit 204 and at least the second voltage supply VVDD or the reference voltage supply VSS. In some embodiments, interconnect 208 is configured to provide the second voltage of the second voltage supply VVDD from the header circuit 202 to the gated power circuit 204.

In some embodiments, interconnect 208 is configured to provide an electrical connection between the ungated power circuit 206 and at least the first voltage supply TVDD. In some embodiments, interconnect 208 is configured to provide the first voltage of the first voltage supply TVDD to ungated power circuit 206.

In some embodiments, interconnect 208 is configured to provide an electrical connection between the gated power circuit 204 and at least the reference voltage supply VSS. In some embodiments, interconnect 208 is configured to provide the reference voltage of the reference voltage supply VSS to the gated power circuit 204 or un-gated power circuit 206.

Interconnect 208 includes a plurality of metallization layers M0, . . . , Mx−1, Mx configured to provide an electrical connection between power supply and ungated power cells 206 and gated power cells 204, where x is an integer corresponding to the metallization layer number. Each layer of the plurality of metallization layers M0, . . . , Mx−1, Mx is stacked upon the preceding metallization layer. Metallization layers M0, . . . , Mx−1, Mx are over ungated power cells 206 and gated power cells 204.

In some embodiments, metallization layer Mx is referred to as a topmost metal layer of integrated circuit 200, metallization layer Mx−1 is referred to as a second topmost metal layer of integrated circuit 200, and metallization layer M0 is referred to as a lowest metal layer or a first metal layer of integrated circuit 200. In some embodiments, header circuit 202 is between metallization layer Mx and metallization layer Mx−1. In some embodiments, header circuit 202 is between other metallization layers. In some embodiments, header circuit 202 is part of interconnect 208. In some embodiments, header circuit 202 and interconnect 208 are formed as part of a back end of line (BEOL) process. In some embodiments, at least a portion of metallization layer Mx or metallization layer Mx−1 extends in the first direction X and the second direction Y.

Other configurations and arrangements of the plurality of metallization layers M0, . . . , Mx−1, Mx are within the contemplated scope of the present disclosure.

Interconnect 208 includes one or more conductive regions 230a, 230b, 230c, 230d (collectively referred to as a "conductive regions 230"), one or more capping layers 240a, 240b, 240c, 240d (collectively referred to as a "capping layer 240"), one or more ILD layers 220a, 220b, 220c (collectively referred to as a "ILD 220") and one or more ILD layers 222a, 222b, 222c (collectively referred to as a "ILD 222").

Each layer of conductive region 230 is a corresponding metallization layer of metallization layers M0, . . . , Mx−1, Mx. In some embodiments, a capping layer of capping layers 240 separates a pair of metallization layers M0, . . . , Mx−1, Mx from each other.

Capping layer 240a is above gated power circuit 204 and un-gated power circuit 206. In some embodiments, each capping layer 240a, 240b, 240c, 240d alternates with a corresponding ILD 220a, 220b, 220c in a third direction Z. In some embodiments, each capping layer 240a, 240b, 240c, 240d alternates with a corresponding ILD 222a, 222b, 222c in the third direction Z. For example, ILDs 220a and 222a are on capping layer 240a, capping layer 240b is on ILDs 220a and 222a, ILDs 220b and 222b are on capping layer 240b, capping layer 240c is on ILD 220b, and ILD 220c is on capping layer 240c. Capping layer 240c1 is on a pair of ILDs of ILD 222b, hard mask 238 is above capping layer 240c1, and ILD 222c is on hard mask 238. Capping layer 240d is on ILDs 220c and 222c.

Conductive region 230a is within the region between ILD 220 and ILD 222. Similarly, conductive region 230b is within the region between ILD 220 and ILD 222. Conductive region 230c is within the region between two ILDs of ILD 220. Similarly, conductive region 230d is within the region between two ILDs of ILD 222.

Conductive region 230a includes a conductive region 230a1 positioned in metallization layer Mx. Conductive region 230b includes a conductive region 230b1 positioned in metallization layer Mx. Conductive region 230c includes a conductive region 230c1 positioned in metallization layer Mx.

In some embodiments, gate 232 is between two ILDs of ILD 222b. In some embodiments, conductive region 230d provides an electrically conductive path between controller 206a of ungated power circuit 206 and gate 232. In some embodiments, controller 206a comprises a switch responsive to a power management control signal. In some embodiments, the switch includes a PMOS or an N-type metal oxide semiconductor (NMOS) transistor.

In some embodiments, a portion of at least one conductive region of conductive regions 230 includes a via, a metal line or a conductive pad. In some embodiments, conductive region 230 formed in ILDs 220 and 222 of interconnect 208 is referred to as one or more redistribution layers (RDL) of integrated circuit 200. In some embodiments, conductive region 230 includes one or more copper or copper alloys, and is formed using one or more single or dual damascene processes. In some embodiments, conductive region 230 includes one or more layers of metal materials, such as Al, Cu, W, Ti, Ta, TiN, TaN, NiSi, CoSi, other suitable conductive materials, or combinations thereof. Other configurations, arrangements, number of layers or materials of conductive region 230 are within the contemplated scope of the present disclosure.

In some embodiments, capping layer 240 includes one or more layers of a dielectric material that includes SiN, SiCN, the like or combinations thereof. In some embodiments, one or more layers of the dielectric material are made of a low dielectric constant (low-k) material. In some embodiments, capping layer 240 is also referred to as an ESL. In some embodiments, the capping layer 240 is formed using CVD, spin-on polymeric dielectric or other suitable formation processes. Other configurations, arrangements, number of layers or materials of capping layer 240 are within the contemplated scope of the present disclosure.

In some embodiments, at least ILD 220 or 222 includes one or more layers of a dielectric material that includes SiN, SiCN, the like or combinations thereof. In some embodiments, at least ILD 220 or 222 is formed using CVD, spin-on polymeric dielectric or other suitable formation processes. Other configurations, arrangements, number of layers or materials of at least ILD 220 or 222 are within the contemplated scope of the present disclosure.

Other configurations, arrangements, number of layers or materials of interconnect 208 are within the contemplated scope of the present disclosure.

Conductive structure 210 is coupled to the first voltage supply TVDD and interconnect structure 208. In some embodiments, conductive structure 210 is configured to provide a current I1 or the first voltage of the first voltage supply TVDD to header circuit 202 and ungated power circuit 206 by conductive region 230*a* of interconnect 208. In some embodiments, conductive structure 210 extends in at least a first direction X or a second direction Y.

Conductive structure 212 is coupled to the second voltage supply VVDD and interconnect structure 208. In some embodiments, header circuit 202 is configured to provide a current I2 or the second voltage of the second voltage supply VVDD to conductive structure 212 and gated power circuit 204 by conductive region 230*b* of interconnect 208. In some embodiments, conductive structure 212 extends in at least the first direction X or the second direction Y.

Conductive structure 214 is coupled to the reference voltage supply VSS and interconnect structure 208. In some embodiments, conductive structure 214 is configured to provide the reference voltage of the reference voltage supply VSS to at least gated power circuit 204 or ungated power circuit 206 by conductive region 230*c* of interconnect 208. In some embodiments, conductive structure 214 extends in at least the first direction X or the second direction Y.

Conductive structure 210 includes a conductive portion 210*a* on a conductive portion 210*b*. Similarly, conductive structure 212 includes a conductive portion 212*a* on a conductive portion 212*b*, and conductive structure 214 includes a conductive portion 214*a* on a conductive portion 214*b*.

Conductive portion 210*a*, conductive portion 212*a* and conductive portion 214*a* are conductive structures that overlie and contact corresponding conductive portion 210*b*, conductive portion 212*b* and conductive portion 214*b*. Conductive portion 210*b*, conductive portion 212*b* and conductive portion 214*b* overlie and contact interconnect 208. Conductive portion 210*a*, conductive portion 212*a* and conductive portion 214*a* provide an electrical connection to interconnect 208.

In some embodiments, at least conductive portion 210*a*, 212*a* or 214*a* extends in at least a first direction X or a second direction Y. In some embodiments, at least conductive portion 210*a*, 212*a* or 214*a* is also described as a bump structure. In some embodiments, conductive portion 210*a*, conductive portion 212*a* and conductive portion 214*a* include lead. In some embodiments, conductive portion 210*a*, conductive portion 212*a* and conductive portion 214*a* include lead-free materials such as tin, nickel, gold, silver, copper, or other materials suitable for providing electrical connections to external conductive elements.

In some embodiments, at least conductive portion 210*a*, conductive portion 212*a* or conductive portion 214*a* has a substantially rectangular shape. In some embodiments, at least conductive portion 210*a*, conductive portion 212*a* or conductive portion 214*a* has a substantially spherical shape. In some embodiments, at least conductive portion 210*a*, conductive portion 212*a* or conductive portion 214*a* is a controlled collapse chip connection (C4) bump, ball grid array bump, microbump or the like.

Conductive portion 210*b*, conductive portion 212*b* and conductive portion 214*b* are conductive structures that overlie and contact interconnect 208 through open portions of capping layer 240*d*. Conductive portion 210*b*, conductive portion 212*b* and conductive portion 214*b* provide an electrical connection between corresponding conductive portions 210*a*, 212*a* and 214*a* and corresponding conductive regions 230*a*, 230*b* and 230*c* of interconnect 208. In some embodiments, at least conductive portion 210*b*, 212*b* or 214*b* extends in at least the first direction X or the second direction Y.

In some embodiments, one or more layers of conductive portion 210*b*, conductive portion 212*b* and conductive portion 214*b* is also described as a pad, under bump metallurgy (UBM) layer, redistribution lines (RDLs), a post-passivation interconnect (PPI) structure. In some embodiments, conductive portion 210*b*, conductive portion 212*b* and conductive portion 214*b* include aluminum, tin, nickel, gold, silver, copper, or other materials suitable for providing electrical connections to external conductive elements. Other configurations, arrangements, number of layers or materials of at least conductive portion 210*a*, 210*b*, 212*a*, 212*b*, 214*a* or 214*b* are within the contemplated scope of the present disclosure.

Layout Design of an Integrated Circuit

Figure 3A:
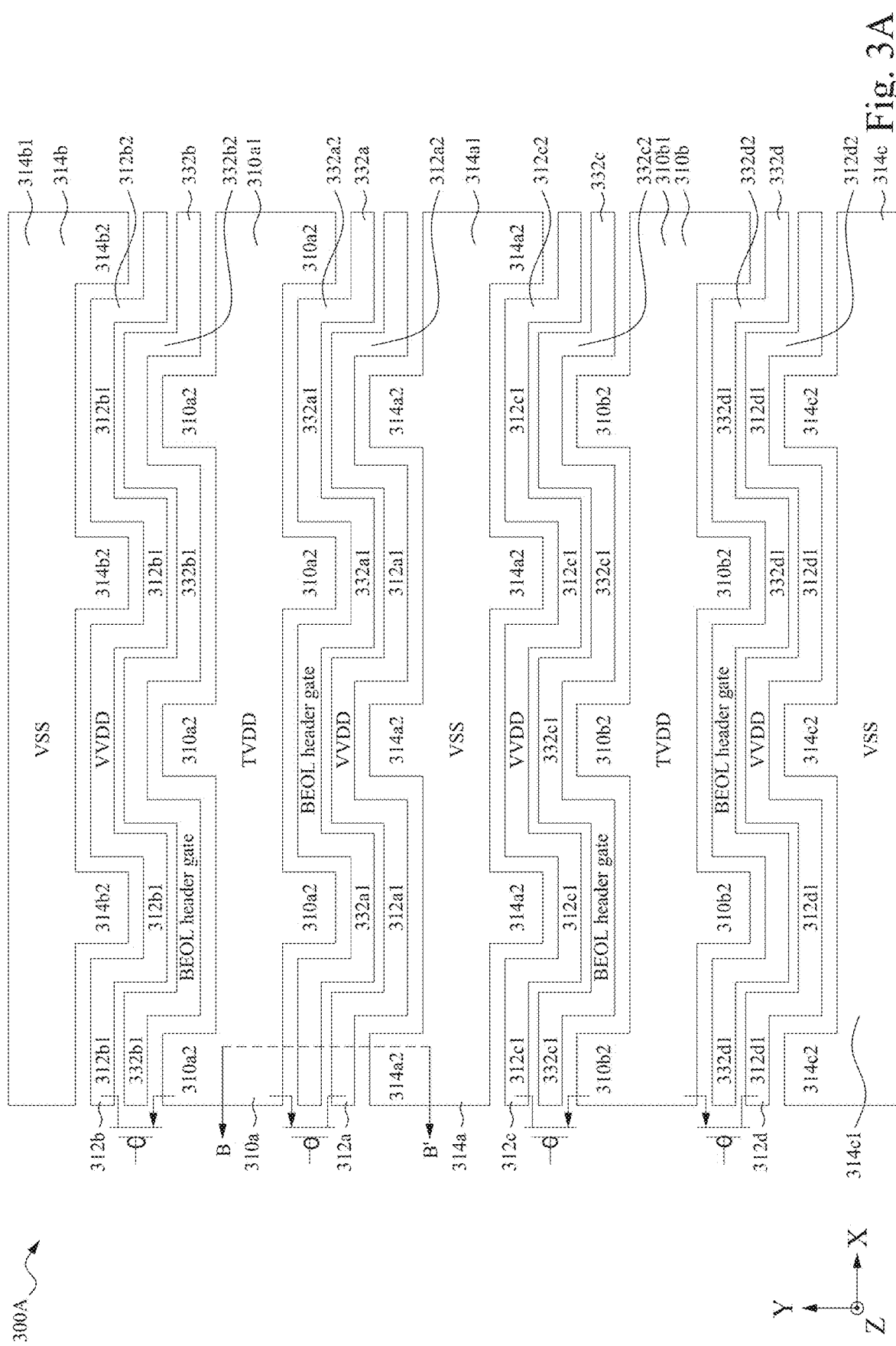
FIG. 3A is a diagram of a layout design of an integrated circuit, in accordance with some embodiments.

FIG. 3A is a diagram of a layout design 300A of an integrated circuit, in accordance with some embodiments. Layout design 300A is a layout diagram of integrated circuit 200 of FIG. 2A.

Layout design 300A is usable to manufacture integrated circuit 200 of FIG. 2A.

Components that are the same or similar to those in one or more of FIGS. 3A-5A (shown below) are given the same reference numbers, and detailed description thereof is thus omitted.

Layout design 300A includes a set of conductive feature layout patterns 310, a set of conductive feature layout patterns 312, a set of conductive feature layout patterns 314 and a set of gate layout patterns 332.

Figure 4A:
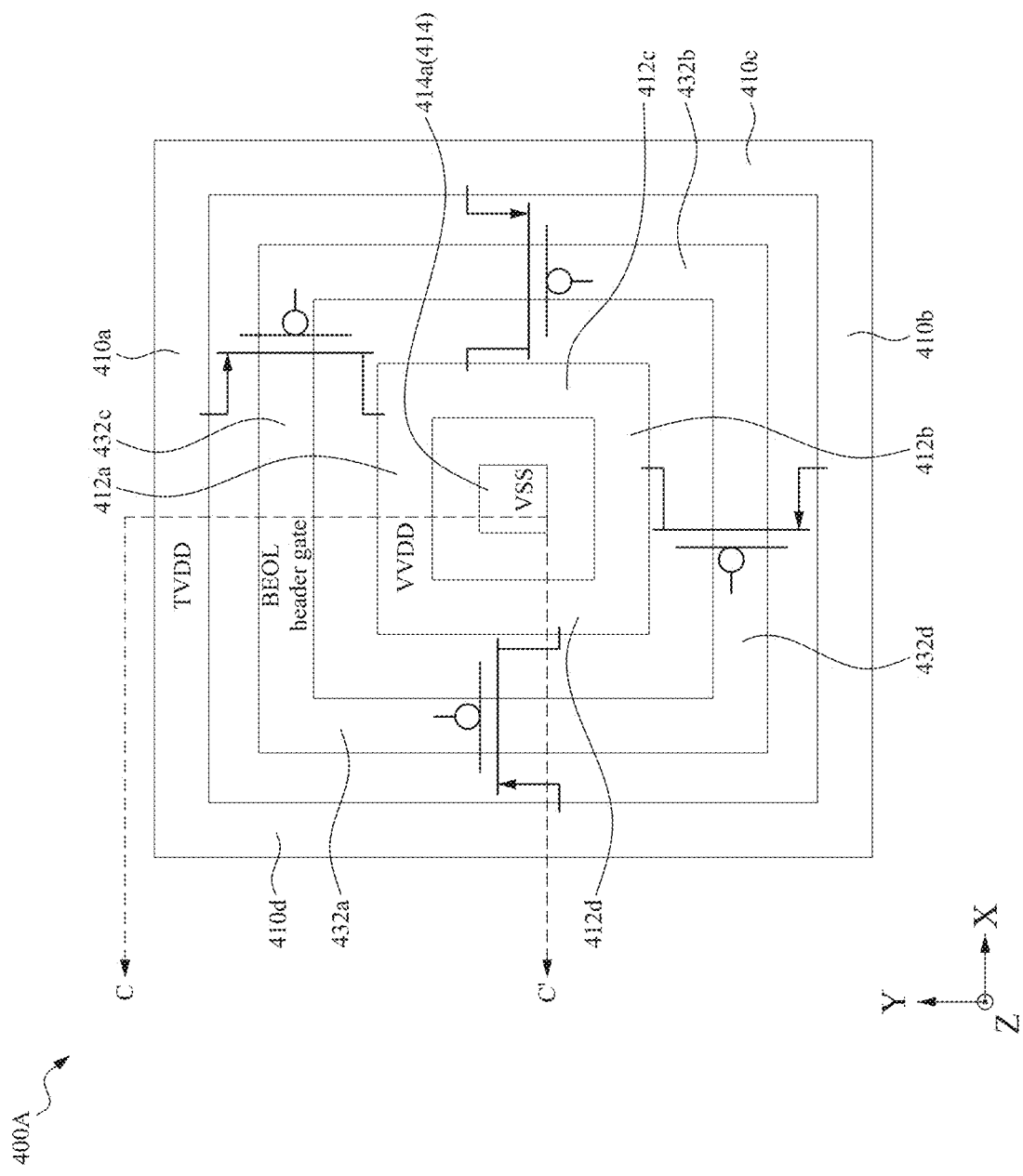
FIG. 4A is a diagram of a layout design of an integrated circuit, in accordance with some embodiments.
Figure 5A:
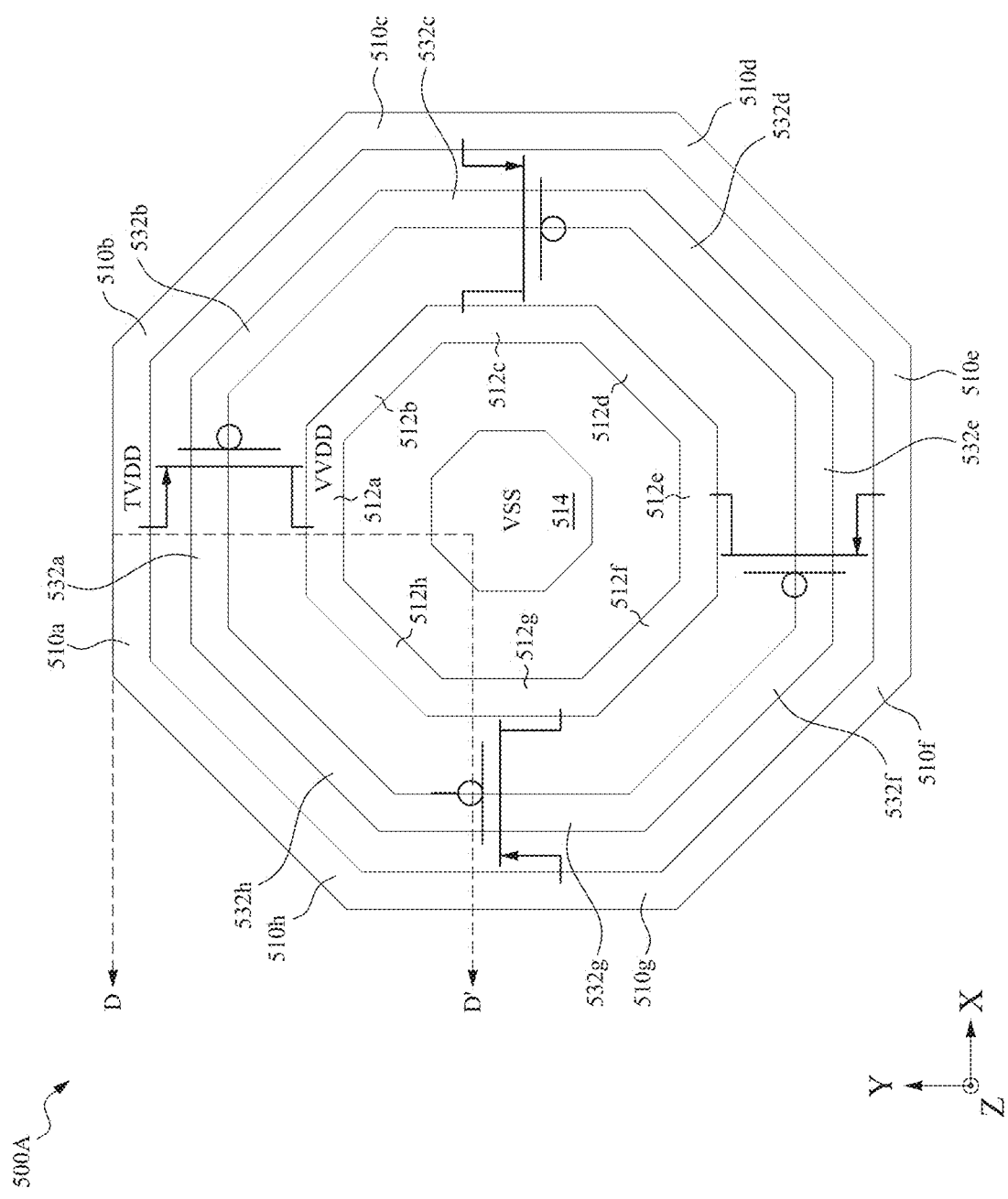
FIG. 5A is a diagram of a layout design of an integrated circuit, in accordance with some embodiments.

In some embodiments, layout design 300A of FIG. 3A, layout design 400A of FIG. 4A or layout design 500A of FIG. 5A includes additional layers or additional layout patterns (e.g., fin layout patterns, upper metal layout patterns, via layout patterns or the like) not shown for simplicity.

Set of conductive feature layout patterns 310 includes one or more of conductive feature layout patterns 310*a* or 310*b*. The set of conductive feature layout patterns 310 extend in the first direction X and the second direction Y. Each of the layout patterns of the set of conductive feature layout patterns 310 is separated from other corresponding layout patterns of the set of conductive feature layout patterns 310 in the second direction Y. Conductive feature layout pattern 310*a* is separated from conductive feature layout pattern 310*b* in the second direction Y.

Figure 3B:
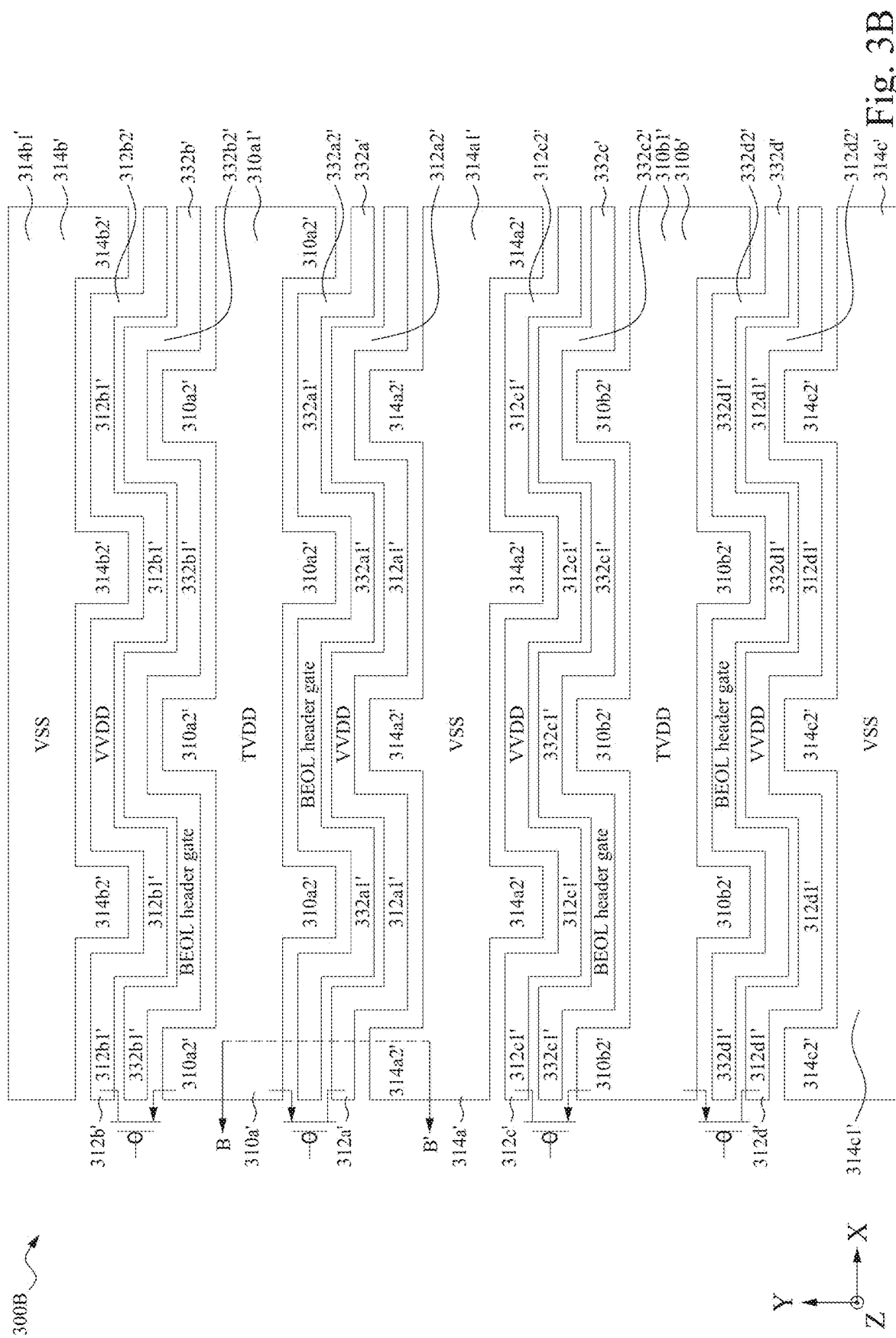
FIG. 3B is a top view of a diagram of an integrated circuit, in accordance with some embodiments.

At least one of conductive feature layout patterns 310*a* or 310*b* of the set of conductive feature layout patterns 310 is usable to manufacture corresponding conductive feature 310*a*' or 310*b*' of the set of conductive features 310' of FIG. 3B. At least one of conductive feature layout patterns 310*a* or 310*b* of the set of conductive feature layout patterns 310 is usable to manufacture conductive region 230*a*1 of FIGS. 2A-2B. In some embodiments, at least one of the set of conductive feature layout patterns 310 is usable to manufacture one or more of conductive region 230a, conductive structure 210, conductive portion 210a or conductive portion 210b.

Conductive feature layout pattern 310a includes a first portion 310a1 that extends in the first direction X coupled to a plurality of second portions 310a2 that extend in the second direction Y or a negative second direction (e.g., negative Y direction). Each of the plurality of second portions 310a2 is separated from adjacent plurality of second portions 310a2 in the first direction X by a spacing interval S1 (not labelled). In some embodiments, each of the spacing intervals S1 (not labelled) is the same. In some embodiments, at least one spacing interval S1 (not labelled) is different from another spacing interval S1 (not labelled).

In some embodiments, a second portion 310a2 that extends in the second direction Y alternates along the first direction X with an adjacent second portion 310a2 that extends in a direction opposite from the second direction (e.g., negative Y direction). For example, in some embodiments, a second portion 310a2 and an adjacent, another second portion 310a2 are oriented in opposite directions from each other. For example in some embodiments, the second portion 310a2 extends in the second direction Y, whereas the adjacent, another second portion 310a2 extends in a direction opposite from the second direction (e.g., negative Y direction).

Conductive feature layout pattern 310b includes a first portion 310b1 that extends in the first direction X coupled to a plurality of second portions 310b2 that extend in the second direction Y or a negative second direction (e.g., negative Y direction). In some embodiments, at least the shape, size or orientation of first portion 310b1 and second portion 310b2 of conductive feature layout pattern 310b is similar to the corresponding first portion 310a1 and second portion 310a2 of conductive feature layout pattern 310a, and similar detailed description is therefore omitted for the sake of brevity.

Set of conductive feature layout patterns 312 includes one or more of conductive feature layout patterns 312a, 312b, 312c or 312d. The set of conductive feature layout patterns 312 extend in the first direction X and the second direction Y. In some embodiments, at least conductive feature layout pattern 312a, 312b, 312c or 312d has a shape similar to a square wave.

Each of the layout patterns of the set of conductive feature layout patterns 312 is separated from other corresponding layout patterns of the set of conductive feature layout patterns 312 in the second direction Y. For example, conductive feature layout pattern 312a is separated from at least conductive feature layout pattern 312b, 312c or 312d in the second direction Y.

At least one of conductive feature layout patterns 312a, 312b, 312c or 312d of the set of conductive feature layout patterns 312 is usable to manufacture corresponding conductive feature 312a', 312b', 312c' or 312d' of the set of conductive features 312' of FIG. 3B. At least one of conductive feature layout patterns 312a, 312b, 312c or 312d of the set of conductive feature layout patterns 312 is usable to manufacture conductive region 230b1 of FIGS. 2A-2B. In some embodiments, at least one of the set of conductive feature layout patterns 312 is usable to manufacture one or more of conductive region 230b, conductive structure 212, conductive portion 212a or conductive portion 212b.

Conductive feature layout pattern 312a includes a plurality of first portions 312a1 that extend in the first direction X and a plurality of second portions 312a2 that extend in the second direction Y. In some embodiments, the plurality of second portions 312a2 extends in the negative second direction (e.g., negative Y direction). In some embodiments, at least one of the plurality of first portions 312a1 or the plurality of second portions 312a2 has a rectangular shape or a square shape.

At least one of the plurality of first portions 312a1 is coupled to at least one of the plurality of second portions 312a2. In some embodiments, one of the plurality of first portions 312a1 is coupled to a pair of the plurality of second portions 312a2. In some embodiments, a pair of the plurality of first portions 312a1 is coupled to one of the plurality of second portions 312a2.

Each of the plurality of first portions 312a1 is separated from an adjacent first portion of the plurality of first portions 312a1 in the first direction X by a spacing interval S3 (not labelled). In some embodiments, each of the spacing intervals S3 (not labelled) is the same. In some embodiments, at least one spacing interval S1, S2 or S3 (not labelled) is different from another spacing interval S1, S2 or S3 (not labelled). In some embodiments, at least one spacing interval S1, S2 or S3 (not labelled) is the same as another spacing interval S1, S2 or S3 (not labelled).

In some embodiments, the plurality of first portions 312a1 is a series of first portions extending in the first direction X that alternate with each other in the second direction Y. For example, in some embodiments, a first portion 312a1 and an adjacent, another first portion 312a1 are separated from each other in the first direction X and the second direction Y.

In some embodiments, the plurality of second portions 312a2 is a series of second portions extending in the second direction Y, and being separated from each other in the first direction X. Each of the plurality of second portions 312a2 is separated from adjacent plurality of second portions 312a2 in the first direction X by a spacing interval S4 (not labelled). In some embodiments, each of the spacing intervals S4 (not labelled) is the same.

Conductive feature layout pattern 312b includes a plurality of first portions 312b1 that extend in the first direction X and a plurality of second portions 312b2 that extend in the second direction Y. In some embodiments, the plurality of second portions 312b2 extends in the negative second direction (e.g., negative Y direction). In some embodiments, at least one of the plurality of first portions 312b1 or the plurality of second portions 312b2 has a rectangular shape or a square shape. In some embodiments, at least the shape, size or orientation of first portion 312b1 and second portion 312b2 of conductive feature layout pattern 312b is similar to the corresponding first portion 312a1 and second portion 312a2 of conductive feature layout pattern 312a, and similar detailed description is therefore omitted for the sake of brevity.

Conductive feature layout pattern 312c includes a plurality of first portions 312c1 that extend in the first direction X and a plurality of second portions 312c2 that extend in the second direction Y. In some embodiments, the plurality of second portions 312c2 extends in the negative second direction (e.g., negative Y direction). In some embodiments, at least one of the plurality of first portions 312c1 or the plurality of second portions 312c2 has a rectangular shape or a square shape. In some embodiments, at least the shape, size or orientation of first portion 312c1 and second portion 312c2 of conductive feature layout pattern 312c is similar to the corresponding first portion 312a1 and second portion 312a2 of conductive feature layout pattern 312a, and similar detailed description is therefore omitted for the sake of brevity.

Conductive feature layout pattern 312d includes a plurality of first portions 312d1 that extend in the first direction X and a plurality of second portions 312d2 that extend in the second direction Y. In some embodiments, the plurality of second portions 312d2 extends in the negative second direction (e.g., negative Y direction). In some embodiments, at least one of the plurality of first portions 312d1 or the plurality of second portions 312d2 has a rectangular shape or a square shape. In some embodiments, at least the shape, size or orientation of first portion 312d1 and second portion 312d2 of conductive feature layout pattern 312d is similar to the corresponding first portion 312a1 and second portion 312a2 of conductive feature layout pattern 312a, and similar detailed description is therefore omitted for the sake of brevity.

Set of conductive feature layout patterns 314 includes one or more of conductive feature layout patterns 314a, 314b or 314c. The set of conductive feature layout patterns 314 extend in the first direction X and the second direction Y. Each of the layout patterns of the set of conductive feature layout patterns 314 is separated from other corresponding layout patterns of the set of conductive feature layout patterns 314 in the second direction Y. For example, conductive feature layout pattern 314a is separated from at least conductive feature layout pattern 314b or 314c in the second direction Y.

At least one of conductive feature layout patterns 314a, 314b or 314c of the set of conductive feature layout patterns 314 is usable to manufacture corresponding conductive feature 314a', 314b' or 314c' of the set of conductive features 314' of FIG. 3B. At least one of conductive feature layout patterns 314a, 314b or 314c of the set of conductive feature layout patterns 314 is usable to manufacture conductive region 230c1 of FIGS. 2A-2B. In some embodiments, at least one of the set of conductive feature layout patterns 314 is usable to manufacture one or more of conductive region 230c, conductive structure 214, conductive portion 214a or conductive portion 214b.

Conductive feature layout pattern 314a includes a first portion 314a1 that extends in the first direction X coupled to a plurality of second portions 314a2 that extend in the second direction Y or a negative second direction (e.g., negative Y direction). Each of the plurality of second portions 314a2 is separated from adjacent plurality of second portions 314a2 in the first direction X by a spacing interval S2 (not labelled). In some embodiments, each of the spacing intervals S2 (not labelled) is the same. In some embodiments, at least one spacing interval S1 or S2 (not labelled) is different from another spacing interval S1 or S2 (not labelled). In some embodiments, at least one spacing interval S1 or S2 (not labelled) is the same as another spacing interval S1 or S2 (not labelled).

In some embodiments, a second portion 314a2 that extends in the second direction Y alternates along the first direction X with an adjacent second portion 314a2 that extends in a direction opposite from the second direction (e.g., negative Y direction). For example, in some embodiments, a second portion 314a2 and an adjacent, another second portion 314a2 are oriented in opposite directions from each other. For example in some embodiments, the second portion 314a2 extends in the second direction Y, whereas the adjacent, another second portion 314a2 extends in a direction opposite from the second direction (e.g., negative Y direction).

Conductive feature layout pattern 314b includes a first portion 314b1 that extends in the first direction X coupled to a plurality of second portions 314b2 that extend in the second direction Y or a negative second direction (e.g., negative Y direction). Although FIG. 3A shows that the plurality of second portions 314b2 shown in FIG. 3A extend in the negative second direction (e.g., negative Y direction), in some embodiments, the plurality of second portions 314b2 also extend in the second direction Y similar to corresponding second portions 314a2. In some embodiments, at least the shape, size or orientation of first portion 314b1 and second portion 314b2 of conductive feature layout pattern 314b is similar to the corresponding first portion 314a1 and second portion 314a2 of conductive feature layout pattern 314a, and similar detailed description is therefore omitted for the sake of brevity.

Conductive feature layout pattern 314c includes a first portion 314c1 that extends in the first direction X coupled to a plurality of second portions 314c2 that extend in the second direction Y or a negative second direction (e.g., negative Y direction). Although FIG. 3A shows that the plurality of second portions 314c2 shown in FIG. 3A extend in the second direction Y, in some embodiments, the plurality of second portions 314c2 also extend in the negative second direction (e.g., negative Y direction) similar to corresponding second portions 314a2. In some embodiments, at least the shape, size or orientation of first portion 314c1 and second portion 314c2 of conductive feature layout pattern 314c is similar to the corresponding first portion 314a1 and second portion 314a2 of conductive feature layout pattern 314a, and similar detailed description is therefore omitted for the sake of brevity.

In some embodiments, at least the shape or size of at least one of conductive feature layout pattern 314a, 314b, 314c, 310a or 310b is similar to at least the shape or size of another of conductive feature layout pattern 314a, 314b, 314c, 310a or 310b. In some embodiments, at least one of conductive feature layout pattern 314a, 314b, 314c, 310a or 310b is similar to another of conductive feature layout pattern 314a, 314b, 314c, 310a or 310b, but they are shifted in position with respect to each other in the second direction Y.

Set of gate layout patterns 332 includes one or more of gate layout patterns 332a, 332b, 332c or 332d. The set of gate layout patterns 332 extend in the first direction X and the second direction Y. In some embodiments, at least gate layout pattern 332a, 332b, 332c or 332d has a shape similar to a square wave.

Each of the layout patterns of the set of gate layout patterns 332 is separated from other corresponding layout patterns of the set of gate layout patterns 332 in the second direction Y. For example, gate layout pattern 332a is separated from at least gate layout pattern 332b, 332c or 332d in the second direction Y.

At least one of gate layout patterns 332a, 332b, 332c or 332d of the set of gate layout patterns 332 is usable to manufacture a corresponding gate 332a', 332b', 332c' or 332d' of the set of gates 332' of FIG. 3B. At least one of gate layout patterns 332a, 332b, 332c or 332d of the set of gate layout patterns 332 is usable to manufacture the gate of PMOS transistor P1 of FIG. 1 or gate 232 of FIG. 2A-2B. In some embodiments, at least one of the set of gate layout patterns 332 is usable to manufacture one or more of gate dielectric layer 234, semiconducting layer 236 or hard mask 238.

Gate layout pattern 332a includes a plurality of first portions 332a1 that extend in the first direction X and a plurality of second portions 332a2 that extend in the second direction Y. In some embodiments, the plurality of second portions 332a2 extends in the negative second direction (e.g., negative Y direction). In some embodiments, at least one of the plurality of first portions 332a1 or the plurality of second portions 332a2 has a rectangular shape or a square shape.

At least one of the plurality of first portions 332a1 is coupled to at least one of the plurality of second portions 332a2. In some embodiments, one of the plurality of first portions 332a1 is coupled to a pair of the plurality of second portions 332a2. In some embodiments, a pair of the plurality of first portions 332a1 is coupled to one of the plurality of second portions 332a2.

Each of the plurality of first portions 332a1 is separated from an adjacent first portion of the plurality of first portions 332a1 in the first direction X by a spacing interval S5 (not labelled). In some embodiments, each of the spacing intervals S5 (not labelled) is the same. In some embodiments, at least one spacing interval S1, S2, S3 or S5 (not labelled) is different from another spacing interval S1, S2, S3 or S5 (not labelled). In some embodiments, at least one spacing interval S1, S2, S3 or S5 (not labelled) is the same as another spacing interval S1, S2, S3 or S5 (not labelled).

In some embodiments, the plurality of first portions 332a1 is a series of first portions extending in the first direction X that alternate with each other in the second direction Y. For example, in some embodiments, a first portion 332a1 and an adjacent, another first portion 332a1 are separated from each other in the first direction X and the second direction Y.

In some embodiments, the plurality of second portions 332a2 is a series of second portions extending in the second direction Y, and being separated from each other in the first direction X. Each of the plurality of second portions 332a2 is separated from adjacent plurality of second portions 332a2 in the first direction X by a spacing interval S6 (not labelled). In some embodiments, each of the spacing intervals S6 (not labelled) is the same. In some embodiments, at least one spacing interval S6 or S4 (not labelled) is the same as another spacing interval S6 or S4 (not labelled). In some embodiments, at least one spacing interval S6 or S4 (not labelled) is different from another spacing interval S6 or S4 (not labelled).

Gate layout pattern 332b includes a plurality of first portions 332b1 that extend in the first direction X and a plurality of second portions 332b2 that extend in the second direction Y. In some embodiments, the plurality of second portions 332b2 extends in the negative second direction (e.g., negative Y direction). In some embodiments, at least one of the plurality of first portions 332b1 or the plurality of second portions 332b2 has a rectangular shape or a square shape. In some embodiments, at least the shape, size or orientation of first portion 332b1 and second portion 332b2 of gate layout pattern 332b is similar to the corresponding first portion 332a1 and second portion 332a2 of gate layout pattern 332a, and similar detailed description is therefore omitted for the sake of brevity.

Gate layout pattern 332c includes a plurality of first portions 332c1 that extend in the first direction X and a plurality of second portions 332c2 that extend in the second direction Y. In some embodiments, the plurality of second portions 332c2 extends in the negative second direction (e.g., negative Y direction). In some embodiments, at least one of the plurality of first portions 332c1 or the plurality of second portions 332c2 has a rectangular shape or a square shape. In some embodiments, at least the shape, size or orientation of first portion 332c1 and second portion 332c2 of gate layout pattern 332c is similar to the corresponding first portion 332a1 and second portion 332a2 of gate layout pattern 332a, and similar detailed description is therefore omitted for the sake of brevity.

Gate layout pattern 332d includes a plurality of first portions 332d1 that extend in the first direction X and a plurality of second portions 332d2 that extend in the second direction Y. In some embodiments, the plurality of second portions 332d2 extends in the negative second direction (e.g., negative Y direction). In some embodiments, at least one of the plurality of first portions 332d1 or the plurality of second portions 332d2 has a rectangular shape or a square shape. In some embodiments, at least the shape, size or orientation of first portion 332d1 and second portion 332d2 of gate layout pattern 332d is similar to the corresponding first portion 332a1 and second portion 332a2 of gate layout pattern 332a, and similar detailed description is therefore omitted for the sake of brevity.

In some embodiments, conductive feature layout patterns 314b and 314c are located on opposite edges of layout design 300A. Conductive feature layout pattern 312b is between conductive feature layout pattern 314b and gate layout pattern 332b. In some embodiments, portions of conductive feature layout pattern 312b interdigitate with portions of conductive feature layout pattern 314b and portions of gate layout pattern 332b.

Gate layout pattern 332b is between conductive feature layout pattern 312b and conductive feature layout pattern 310a. In some embodiments, portions of gate layout pattern 332b interdigitate with portions of conductive feature layout pattern 312b and portions of conductive feature layout pattern 310a.

Conductive feature layout pattern 310a is between gate layout pattern 332b and gate layout pattern 332a. In some embodiments, portions of conductive feature layout pattern 310a interdigitate with portions of gate layout pattern 332b and portions of gate layout pattern 332a.

Gate layout pattern 332a is between conductive feature layout pattern 310a and conductive feature layout pattern 312a. In some embodiments, portions of gate layout pattern 332a interdigitate with portions of conductive feature layout pattern 310a and portions of conductive feature layout pattern 312a.

Conductive feature layout pattern 312a is between gate layout pattern 332a and conductive feature layout pattern 314a. In some embodiments, portions of conductive feature layout pattern 312a interdigitate with portions of gate layout pattern 332a and portions of conductive feature layout pattern 314a.

Conductive feature layout pattern 314a is between conductive feature layout pattern 312a and conductive feature layout pattern 312c. In some embodiments, portions of conductive feature layout pattern 314a interdigitate with portions of conductive feature layout pattern 312a and portions of conductive feature layout pattern 312c.

Conductive feature layout pattern 312c is between conductive feature layout pattern 314a and gate layout pattern 332c. In some embodiments, portions of conductive feature layout pattern 312c interdigitate with portions of conductive feature layout pattern 314a and portions of gate layout pattern 332c.

Gate layout pattern 332c is between conductive feature layout pattern 312c and conductive feature layout pattern 310b. In some embodiments, portions of gate layout pattern 332c interdigitate with portions of conductive feature layout pattern 312c and portions of conductive feature layout pattern 310b.

Conductive feature layout pattern 310b is between gate layout pattern 332c and gate layout pattern 332d. In some embodiments, portions of conductive feature layout pattern 310b interdigitate with portions of gate layout pattern 332c and portions of gate layout pattern 332d.

Gate layout pattern 332d is between conductive feature layout pattern 310b and conductive feature layout pattern 312d. In some embodiments, portions of gate layout pattern 332d interdigitate with portions of conductive feature layout pattern 310b and portions of conductive feature layout pattern 312d.

Conductive feature layout pattern 312d is between gate layout pattern 332d and conductive feature layout pattern 314c. In some embodiments, portions of conductive feature layout pattern 312d interdigitate with portions of gate layout pattern 332d and portions of conductive feature layout pattern 314c.

In some embodiments, the set of gate layout patterns 332 is positioned on a first layout level. In some embodiments, the first layout level is referred to as a gate layout level.

In some embodiments, at least the set of conductive feature layout patterns 310, the set of conductive feature layout patterns 312 or the set of conductive feature layout patterns 314 is located on a second layout level. In some embodiments, the second layout level is referred to as a metallization layout level. In some embodiments, the second layout level is referred to as a topmost metallization layout level. In some embodiments, the first layout level is at least one metallization layout level below the topmost metallization layout level. In some embodiments, the first layout level is different from the second layout level. In some embodiments, the second layout level is the same as the first layout level.

Other configurations or numbers of gate layout patterns in the set of gate layout patterns 332 are within the scope of the present disclosure.

Other configurations or numbers of conductive feature layout patterns in the set of conductive feature layout patterns 310, 312 or 314 are within the scope of the present disclosure.

In some embodiments, by extending each of the set of conductive feature layout patterns 310, a set of conductive feature layout patterns 312, a set of conductive feature layout patterns 314 and set of gate layout patterns 332 in two directions (e.g., first direction X and second direction Y), each of set of conductive feature layout patterns 310, a set of conductive feature layout patterns 312, a set of conductive feature layout patterns 314 and set of gate layout patterns 332 has a larger effective header width than other approaches. In some embodiments, by having a larger effective header width results an increase in the header density of layout design 300A causing a greater electron mobility and therefore a higher driving current capability than other approaches.

FIG. 3B is a top view of a diagram of an integrated circuit 300B, in accordance with some embodiments.

In some embodiments, integrated circuit 300B is manufactured by layout design 300A of FIG. 3A. Structural relationships including at least alignment, lengths and widths, as well as connections and configurations of integrated circuit 300B of FIG. 3B are similar to corresponding structural relationships, corresponding connections and corresponding configurations of layout design 300A of FIG. 3A, and similar detailed description is therefore omitted for the sake of brevity.

Integrated circuit 300B includes set of conductive features 310', set of conductive features 312', set of conductive features 314' and set of gates 332'.

In some embodiments, integrated circuit 300B, integrated circuit 400B (FIG. 4B) or integrated circuit 500B (FIG. 5B) includes additional layers (e.g., fins, lower or upper metal layers, transistor devices, vias or the like) not shown for simplicity.

Set of conductive features 310' includes one or more of conductive features 310a' or 310b'. In some embodiments, the set of conductive features 310' are manufactured by the set of conductive feature layout patterns 310 of FIG. 3A.

Set of conductive features 312' includes one or more of conductive features 312a', 312b', 312c' or 312d'. In some embodiments, the set of conductive features 312' are manufactured by the set of conductive feature layout patterns 312 of FIG. 3A.

Set of conductive features 314' includes one or more of conductive features 314a', 314b' or 314c'. In some embodiments, the set of conductive features 314' are manufactured by the set of conductive feature layout patterns 314 of FIG. 3A.

In some embodiments, the structural relationships, connections and configurations of conductive features 310a', 310b', 312a', 312b', 312c', 312d', 314a', 314b' and 314c' are similar to corresponding structural relationships, corresponding connections and corresponding configurations of corresponding conductive feature layout patterns 310a, 310b, 312a, 312b, 312c, 312d, 314a, 314b and 314c of FIG. 3A, and similar detailed description is therefore omitted for the sake of brevity.

Set of gates 332' includes one or more of gates 332a', 332b', 332c' or 332d'. In some embodiments, the set of gates 332' are manufactured by the set of gate layout patterns 332 of FIG. 3A. In some embodiments, the structural relationships, connections and configurations of gates 332a', 332b', 332c' and 332d' of the set of gates 332' are similar to corresponding structural relationships, corresponding connections and corresponding configurations of corresponding gate layout patterns 332a, 332b, 332c and 332d of the set of gate layout patterns 332 of FIG. 3A, and similar detailed description is therefore omitted for the sake of brevity.

By having gates 332a', 332b', 332c' or 332d' of the set of gates 332' extend in at least 2 directions (first direction X and second direction Y), the effective gate width of the set of gates 332' is larger than other approaches where the gate extends in only a single direction. By having a larger effective gate width results in an increase in the header density of integrated circuit 300B causing a greater electron mobility and therefore higher current driving capability than other approaches.

In some embodiments, by extending at least the set of conductive features 310', the set of conductive features 312', the set of conductive features 314' or the set of gates 332' in two directions (e.g., first direction X and second direction Y), causes integrated circuit 300B to have a larger effective header width than other approaches. In some embodiments, by having a larger effective header width results in an increase in the header density of integrated circuit 300B causing a greater electron mobility and therefore a higher driving current capability than other approaches.

Layout Design of an Integrated Circuit

FIG. 4A is a diagram of a layout design 400A of an integrated circuit, in accordance with some embodiments. Layout design 400A is a layout design of an integrated circuit 400B (FIG. 4B) having a polygonal shape.

Layout design 400A is usable to manufacture integrated circuit 200 of FIG. 2A.

Layout design 400A includes a set of conductive feature layout patterns 410, a set of conductive feature layout patterns 412, a set of conductive feature layout patterns 414 and a set of gate layout patterns 432.

Set of conductive feature layout patterns 410 includes one or more of conductive feature layout patterns 410a, 410b, 410c or 410d. In some embodiments, conductive feature layout patterns 410a, 410b, 410c or 410d are coupled together such that the set of conductive feature layout patterns 410 is a continuous layout pattern. In some embodiments, the set of conductive feature layout patterns 410 has a shape corresponding to a polygon. In some embodiments, the set of conductive feature layout patterns 410 has a square shape.

The set of conductive feature layout patterns 410 extend in the first direction X and the second direction Y. Conductive feature layout patterns 410a and 410b extend in the first direction X, and conductive feature layout patterns 410c and 410d extend in the second direction Y. Conductive feature layout patterns 410a and 410b are separated from each other in the second direction Y, and conductive feature layout patterns 410c and 410d are separated from each other in the first direction X.

In some embodiments, a first end of conductive feature layout pattern 410a contacts a first end of conductive feature layout pattern 410c, and a second end of conductive feature layout pattern 410a contacts a first end of conductive feature layout pattern 410d. In some embodiments, a first end of conductive feature layout pattern 410b contacts a second end of conductive feature layout pattern 410c, and a second end of conductive feature layout pattern 410b contacts a second end of conductive feature layout pattern 410d.

Figure 4B:
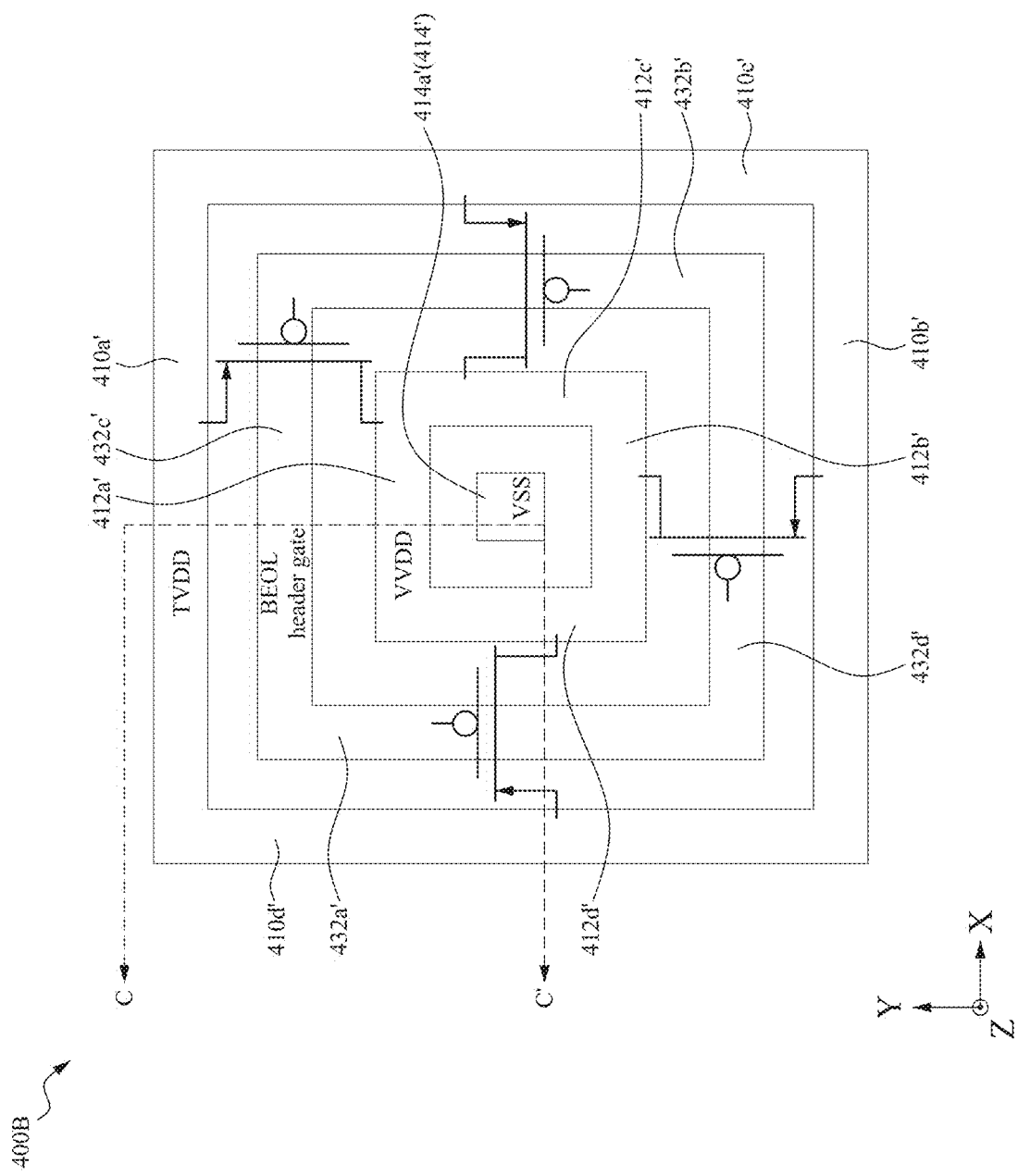
FIG. 4B is a top view of a diagram of an integrated circuit, in accordance with some embodiments.
Figure 5B:
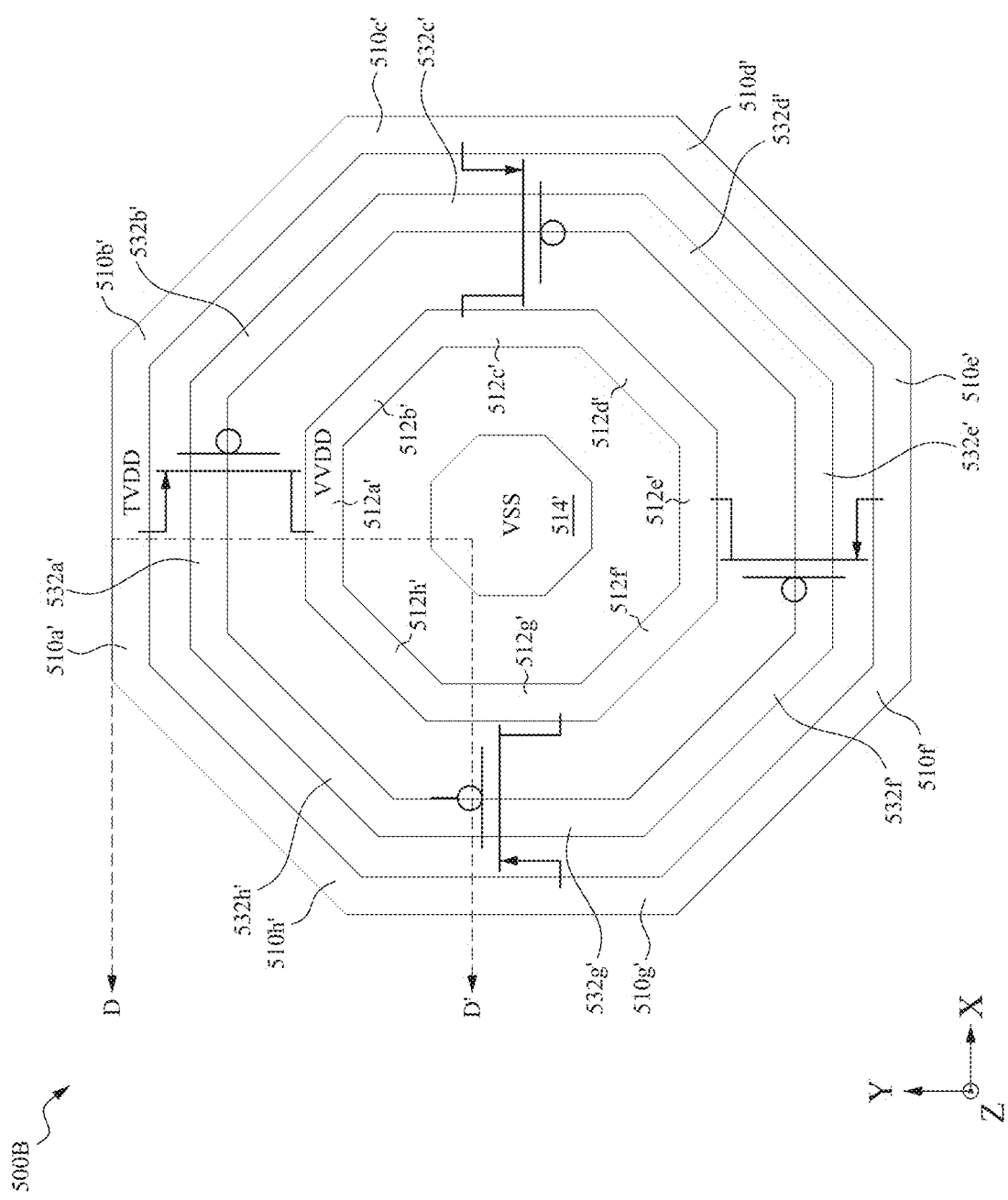
FIG. 5B is a top view of a diagram of an integrated circuit, in accordance with some embodiments.

At least one of conductive feature layout patterns 410a, 410b, 410c or 410d of the set of conductive feature layout patterns 410 is usable to manufacture corresponding conductive feature 410a', 410b', 410c' or 410d' of the set of conductive features 410' of FIG. 4B. At least one of conductive feature layout patterns 410a, 410b, 410c or 410d of the set of conductive feature layout patterns 410 is usable to manufacture conductive region 230a1 of FIGS. 2A-2B. In some embodiments, at least one of the set of conductive feature layout patterns 410 is usable to manufacture one or more of conductive region 230a, conductive structure 210, conductive portion 210a or conductive portion 210b.

Each of the conductive feature layout patterns 410a, 410b, 410c or 410d of the set of conductive feature layout patterns 410 has a corresponding length in the first direction X or the second direction Y. In some embodiments, the sum of the corresponding lengths of the set of conductive feature layout patterns 410 is equal to an effective width of the set of conductive feature layout patterns 410.

Set of conductive feature layout patterns 412 includes one or more of conductive feature layout patterns 412a, 412b, 412c or 412d. In some embodiments, conductive feature layout patterns 412a, 412b, 412c or 412d are coupled together such that the set of conductive feature layout patterns 412 is a continuous layout pattern. In some embodiments, the set of conductive feature layout patterns 412 has a shape corresponding to a polygon. In some embodiments, the set of conductive feature layout patterns 412 has a square shape.

The set of conductive feature layout patterns 412 extend in the first direction X and the second direction Y. Conductive feature layout patterns 412a and 412b extend in the first direction X, and conductive feature layout patterns 412c and 412d extend in the second direction Y. Conductive feature layout patterns 412a and 412b are separated from each other in the second direction Y, and conductive feature layout patterns 412c and 412d are separated from each other in the first direction X.

In some embodiments, a first end of conductive feature layout pattern 412a contacts a first end of conductive feature layout pattern 412c, and a second end of conductive feature layout pattern 412a contacts a first end of conductive feature layout pattern 412d. In some embodiments, a first end of conductive feature layout pattern 412b contacts a second end of conductive feature layout pattern 410c, and a second end of conductive feature layout pattern 410b contacts a second end of conductive feature layout pattern 412d.

At least one of conductive feature layout patterns 412a, 412b, 412c or 412d of the set of conductive feature layout patterns 412 is usable to manufacture corresponding conductive feature 412a', 412b', 412c' or 412d' of the set of conductive features 412' of FIG. 4B. At least one of conductive feature layout patterns 412a, 412b, 412c or 412d of the set of conductive feature layout patterns 412 is usable to manufacture conductive region 230b1 of FIGS. 2A-2B. In some embodiments, at least one of the set of conductive feature layout patterns 412 is usable to manufacture one or more of conductive region 230b, conductive structure 212, conductive portion 212a or conductive portion 212b.

Each of the conductive feature layout patterns 412a, 412b, 412c or 412d of the set of conductive feature layout patterns 412 has a corresponding length in the first direction X or the second direction Y. In some embodiments, the sum of the corresponding lengths of the set of conductive feature layout patterns 412 is equal to an effective width of the set of conductive feature layout patterns 412.

Set of conductive feature layout patterns 414 includes at least a conductive feature layout pattern 414a. The set of conductive feature layout patterns 414 extends in at least the first direction X or the second direction Y. In some embodiments, conductive feature layout pattern 414a is positioned at a center of the set of conductive feature layout patterns 412.

In some embodiments, the set of conductive feature layout patterns 414 has a shape corresponding to a polygon. In some embodiments, the set of conductive feature layout patterns 414 has a square shape.

In some embodiments, the set of conductive feature layout patterns 414 includes a number of conductive feature layout patterns similar to the conductive feature layout patterns 412a, 412b, 412c or 412d of the set of conductive feature layout patterns 412. For example, in some embodiments, the set of conductive feature layout patterns 414 has a square shape with an open region in the center.

At least conductive feature layout pattern 414a of the set of conductive feature layout patterns 414 is usable to manufacture corresponding conductive feature 414a' of the set of conductive features 414' of FIG. 4B. At least conductive feature layout pattern 414a of the set of conductive feature layout patterns 414 is usable to manufacture conductive region 230c1 of FIGS. 2A-2B. In some embodiments, at least one of the set of conductive feature layout patterns 414 is usable to manufacture one or more of conductive region 230c, conductive structure 214, conductive portion 214a or conductive portion 214b.

Each of the conductive feature layout patterns 414a of the set of conductive feature layout patterns 414 has a corresponding length in the first direction X or the second direction Y. In some embodiments, the sum of the corresponding lengths of the set of conductive feature layout patterns 414 is equal to an effective width of the set of conductive feature layout patterns 414.

Set of gate layout patterns 432 includes one or more of gate layout patterns 432a, 432b, 432c or 432d. In some embodiments, gate layout patterns 432a, 432b, 432c or 432d are coupled together such that the set of gate layout patterns 432 is a continuous layout pattern. In some embodiments, the set of gate layout patterns 432 has a shape corresponding to a polygon. In some embodiments, the set of gate layout patterns 432 has a square shape.

The set of gate layout patterns 432 extend in the first direction X and the second direction Y. Gate layout patterns 432a and 432b extend in the second direction Y, and gate layout patterns 432c and 432d extend in the first direction X. Gate layout patterns 432a and 432b are separated from each other in the first direction X, and gate layout patterns 432c and 432d are separated from each other in the second direction Y.

In some embodiments, a first end of gate layout pattern 432a contacts a first end of gate layout pattern 432c, and a second end of gate layout pattern 432a contacts a first end of gate layout pattern 432d. In some embodiments, a first end of gate layout pattern 432b contacts a second end of gate layout pattern 432c, and a second end of gate layout pattern 432b contacts a second end of gate layout pattern 432d.

At least one of gate layout patterns 432a, 432b, 432c or 432d of the set of gate layout patterns 432 is usable to manufacture a corresponding gate 432a', 432b', 432c' or 432d' of the set of gates 432' of FIG. 4B. At least one of gate layout patterns 432a, 432b, 432c or 432d of the set of gate layout patterns 432 is usable to manufacture the gate of PMOS transistor P1 of FIG. 1 or gate 232 of FIG. 2A-2B. In some embodiments, at least one of the set of gate layout patterns 432 is usable to manufacture one or more of gate dielectric layer 234, semiconducting layer 236 or hard mask 238.

Each of the gate layout patterns 432a, 432b, 432c or 432d of the set of gate layout patterns 432 has a corresponding length in the first direction X or the second direction Y. In some embodiments, the sum of the corresponding lengths of the set of gate layout patterns 432 is equal to an effective gate layout pattern width of the set of gate layout patterns 432.

In some embodiments, the set of conductive feature layout patterns 412 enclose a periphery of the set of conductive feature layout patterns 414. In some embodiments, the set of conductive feature layout patterns 412 are separated from the set of conductive feature layout patterns 414 in at least the first direction X or the second direction Y. In some embodiments, an area of the set of conductive feature layout pattern 412 is different from an area of the set of conductive feature layout patterns 414.

In some embodiments, the set of gate layout patterns 432 enclose a periphery of the set of conductive feature layout patterns 412. In some embodiments, gate layout patterns 432a, 432b of the set of gate layout patterns 432 are separated from corresponding conductive feature layout patterns 412d, 412c of the set of conductive feature layout patterns 412 in the first direction X by a first distance D1 (not labelled). In some embodiments, gate layout patterns 432c, 432d of the set of gate layout patterns 432 are separated from corresponding conductive feature layout patterns 412a, 412b of the set of conductive feature layout patterns 412 in the second direction Y by a second distance D2 (not labelled).

In some embodiments, the set of conductive feature layout patterns 410 enclose a periphery of the set of gate layout patterns 432. In some embodiments, conductive feature layout patterns 410d, 410c of the set of conductive feature layout patterns 410 are separated from corresponding gate layout patterns 432a, 432b of the set of gate layout patterns 432 in the first direction X by the first distance D1 (not labelled). In some embodiments, conductive feature layout patterns 410a, 410b of the set of conductive feature layout patterns 410 are separated from corresponding gate layout patterns 432c, 432d of the set of gate layout patterns 432 in the second direction Y by the second distance D2 (not labelled). In some embodiments, distance D1 is different from distance D2. In some embodiments, distance D1 is the same as distance D2.

In some embodiments, at least an area of the set of conductive feature layout patterns 410, the set of conductive feature layout patterns 412, the set of conductive feature layout patterns 414 or the set of gate layout patterns 432 is different from at least another area of the set of conductive feature layout patterns 410, the set of conductive feature layout patterns 412, the set of conductive feature layout patterns 414 or the set of gate layout patterns 432. In some embodiments, at least an area of the set of conductive feature layout patterns 410, the set of conductive feature layout patterns 412, the set of conductive feature layout patterns 414 or the set of gate layout patterns 432 is the same as at least another area of the set of conductive feature layout patterns 410, the set of conductive feature layout patterns 412, the set of conductive feature layout patterns 414 or the set of gate layout patterns 432.

Other configurations or numbers of gate layout patterns in the set of gate layout patterns 432 are within the scope of the present disclosure.

Other configurations or numbers of conductive feature layout patterns in the set of conductive feature layout patterns 410, 412 or 414 are within the scope of the present disclosure.

By having gate layout patterns 432a, 432b, 432c or 432d of the set of gate layout patterns 432 extend in at least 2 directions (first direction X and second direction Y), the effective gate layout pattern width of the set of gate layout patterns 432 is larger than other approaches where the gate layout pattern extends in only a single direction. By having a larger effective gate layout pattern width, layout design 400A is usable to manufacture an integrated circuit 400B with a larger effective gate width resulting in greater electron mobility and therefore higher current driving capability than other approaches.

In some embodiments, by extending each of the set of conductive feature layout patterns 410, a set of conductive feature layout patterns 412, a set of conductive feature layout patterns 414 and set of gate layout patterns 432 in two directions (e.g., first direction X and second direction Y), each of set of conductive feature layout patterns 410, a set of conductive feature layout patterns 412, a set of conductive feature layout patterns 414 and set of gate layout patterns 432 has a larger effective header width than other approaches. In some embodiments, by having a larger effective header width results an increase in the header density of layout design 400A causing a greater electron mobility and therefore a higher driving current capability than other approaches.

FIG. 4B is a top view of a diagram of an integrated circuit 400B, in accordance with some embodiments.

In some embodiments, integrated circuit 400B is manufactured by layout design 400A of FIG. 4A. Structural relationships including at least alignment, lengths and widths, as well as connections and configurations of integrated circuit 400B of FIG. 4B are similar to corresponding structural relationships, corresponding connections and corresponding configurations of layout design 400A of FIG. 4A, and similar detailed description is therefore omitted for the sake of brevity.

Integrated circuit 400B includes set of conductive features 410', set of conductive features 412', set of conductive features 414' and set of gates 432'.

Set of conductive features 410' includes one or more of conductive features 410a', 410b', 410c' or 410d'. In some embodiments, the set of conductive features 410' are manufactured by the set of conductive feature layout patterns 410 of FIG. 4A.

Set of conductive features 412' includes one or more of conductive features 412a', 412b', 412c' or 412d'. In some embodiments, the set of conductive features 412' are manufactured by the set of conductive feature layout patterns 412 of FIG. 4A.

Set of conductive features 414' includes one or more of conductive features 414a'. In some embodiments, the set of conductive features 414' are manufactured by the set of conductive feature layout patterns 414 of FIG. 4A.

In some embodiments, the structural relationships, connections and configurations of conductive features 410a', 410b', 410c', 410d', 412a', 412b', 412c', 412d' and 414a' are similar to corresponding structural relationships, corresponding connections and corresponding configurations of corresponding conductive feature layout patterns 410a, 410b, 410c, 410d, 412a, 412b, 412c, 412d and 414a of FIG. 4A, and similar detailed description is therefore omitted for the sake of brevity.

Set of gates 432' includes one or more of gates 432a', 432b', 432c' or 432d'. In some embodiments, the set of gates 432' are manufactured by the set of gate layout patterns 432 of FIG. 4A. In some embodiments, the structural relationships, connections and configurations of gates 432a', 432b', 432c' and 432d' of the set of gates 432' are similar to corresponding structural relationships, corresponding connections and corresponding configurations of corresponding gate layout patterns 432a, 432b, 432c and 432d of the set of gate layout patterns 432 of FIG. 4A, and similar detailed description is therefore omitted for the sake of brevity.

By having gates 432a', 432b', 432c' or 432d' of the set of gates 432' extend in at least 2 directions (first direction X and second direction Y), the effective gate width of the set of gates 432' is larger than other approaches where the gate extends in only a single direction. By having a larger effective gate width results in an increase in the header density of integrated circuit 400B causing a greater electron mobility and therefore higher current driving capability than other approaches.

In some embodiments, by extending at least the set of conductive features 410', the set of conductive features 412', the set of conductive features 414' or the set of gates 432' in two directions (e.g., first direction X and second direction Y), causes integrated circuit 400B to have a larger effective header width than other approaches. In some embodiments, by having a larger effective header width results in an increase in the header density of integrated circuit 400B causing a greater electron mobility and therefore a higher driving current capability than other approaches.

Layout Design of an Integrated Circuit

FIG. 5A is a diagram of a layout design 500A of an integrated circuit, in accordance with some embodiments. Layout design 500A is a layout design of an integrated circuit 500B (FIG. 5B) having an octagonal shape.

Layout design 500A is usable to manufacture integrated circuit 200 of FIG. 2A.

Layout design 500A includes a set of conductive feature layout patterns 510, a set of conductive feature layout patterns 512, a set of conductive feature layout patterns 514 and a set of gate layout patterns 532.

Set of conductive feature layout patterns 510 includes one or more of conductive feature layout patterns 510a, 510b, 510c, 510d, 510e, 510f, 510g or 510h. In some embodiments, conductive feature layout patterns 510a, 510b, 510c, 510d, 510e, 510f, 510g or 510h are coupled together such that the set of conductive feature layout patterns 510 is a continuous layout pattern. In some embodiments, the set of conductive feature layout patterns 510 has a shape corresponding to a polygon. In some embodiments, the set of conductive feature layout patterns 510 has an octagonal shape.

The set of conductive feature layout patterns 510 extend in at least the first direction X, the second direction Y, a fourth direction M or a fifth direction N. In some embodiments, the fourth direction M or the fifth direction N is different from another of the first direction X, the second direction Y, fourth direction M or the fifth direction N. In some embodiments, the fourth direction M is offset from the fifth direction N by 90 degrees.

Conductive feature layout patterns 510a and 510e extend in the first direction X, conductive feature layout patterns 510c and 510g extend in the second direction Y, conductive feature layout patterns 510b and 510f extend in the fourth direction M, and conductive feature layout patterns 510d and 510h extend in the fifth direction N.

Conductive feature layout patterns 510a and 510e are separated from each other in the second direction Y, conductive feature layout patterns 510c and 510g are separated from each other in the first direction X, conductive feature layout patterns 510b and 510f are separated from each other in the fifth direction N, and conductive feature layout patterns 510d and 510h are separated from each other in the fourth direction M.

In some embodiments, a first end of conductive feature layout pattern 510a contacts a first end of conductive feature layout pattern 510h, and a second end of conductive feature layout pattern 510a contacts a first end of conductive feature layout pattern 510b.

In some embodiments, a first end of conductive feature layout pattern 510e contacts a first end of conductive feature layout pattern 510f, and a second end of conductive feature layout pattern 510e contacts a first end of conductive feature layout pattern 510d.

In some embodiments, a first end of conductive feature layout pattern 510c contacts a second end of conductive feature layout pattern 510d, and a second end of conductive feature layout pattern 510c contacts a second end of conductive feature layout pattern 510b.

In some embodiments, a first end of conductive feature layout pattern 510g contacts a second end of conductive feature layout pattern 510f, and a second end of conductive feature layout pattern 510g contacts a second end of conductive feature layout pattern 510h.

At least one of conductive feature layout patterns 510a, 510b, 510c, 510d, 510e, 510f, 510g or 510h of the set of conductive feature layout patterns 510 is usable to manufacture corresponding conductive feature 510a', 510b', 510c', 510d', 510e', 510f, 510g' or 510h' of the set of conductive features 510' of FIG. 5B. At least one of conductive feature layout patterns 510a, 510b, 510c, 510d, 510e, 510f, 510g or 510h of the set of conductive feature layout patterns 510 is usable to manufacture conductive region 230a1 of FIGS. 2A-2B. In some embodiments, at least one of the set of conductive feature layout patterns 510 is usable to manufacture one or more of conductive region 230a, conductive structure 210, conductive portion 210a or conductive portion 210b.

Each of the conductive feature layout patterns 510a, 510b, 510c, 510d, 510e, 510f, 510g or 510h of the set of conductive feature layout patterns 510 has a corresponding length in the first direction X, the second direction Y, the fourth direction M or the fifth direction N. In some embodiments, the sum of the corresponding lengths of the set of conductive feature layout patterns 510 is equal to an effective width of the set of conductive feature layout patterns 510.

Set of conductive feature layout patterns 512 includes one or more of conductive feature layout patterns 512a, 512b, 512c, 512d, 512e, 512f, 512g or 512h. In some embodiments, conductive feature layout patterns 512a, 512b, 512c, 512d, 512e, 512f, 512g or 512h are coupled together such that the set of conductive feature layout patterns 512 is a continuous layout pattern. In some embodiments, the set of conductive feature layout patterns 512 has a shape corresponding to a polygon. In some embodiments, the set of conductive feature layout patterns 512 has an octagonal shape.

The set of conductive feature layout patterns 512 extend in at least the first direction X, the second direction Y, the fourth direction M or the fifth direction N. Conductive feature layout patterns 512a and 512e extend in the first direction X, conductive feature layout patterns 512c and 512g extend in the second direction Y, conductive feature layout patterns 512b and 512f extend in the fourth direction M, and conductive feature layout patterns 512d and 512h extend in the fifth direction N.

Conductive feature layout patterns 512a and 512e are separated from each other in the second direction Y, conductive feature layout patterns 512c and 512g are separated from each other in the first direction X, conductive feature layout patterns 512b and 512f are separated from each other in the fifth direction N, and conductive feature layout patterns 512d and 512h are separated from each other in the fourth direction M.

In some embodiments, a first end of conductive feature layout pattern 512a contacts a first end of conductive feature layout pattern 512h, and a second end of conductive feature layout pattern 512a contacts a first end of conductive feature layout pattern 512b.

In some embodiments, a first end of conductive feature layout pattern 512e contacts a first end of conductive feature layout pattern 512f, and a second end of conductive feature layout pattern 512e contacts a first end of conductive feature layout pattern 512d.

In some embodiments, a first end of conductive feature layout pattern 512c contacts a second end of conductive feature layout pattern 512d, and a second end of conductive feature layout pattern 512c contacts a second end of conductive feature layout pattern 512b.

In some embodiments, a first end of conductive feature layout pattern 512g contacts a second end of conductive feature layout pattern 512f, and a second end of conductive feature layout pattern 512g contacts a second end of conductive feature layout pattern 512h.

At least one of conductive feature layout patterns 512a, 512b, 512c, 512d, 512e, 512f, 512g or 512h of the set of conductive feature layout patterns 512 is usable to manufacture corresponding conductive feature 512a', 512b', 512c', 512d', 512e', 512f, 512g' or 512h' of the set of conductive features 512' of FIG. 5B. At least one of conductive feature layout patterns 512a, 512b, 512c, 512d, 512e, 512f, 512g or 512h of the set of conductive feature layout patterns 512 is usable to manufacture conductive region 230b1 of FIGS. 2A-2B. In some embodiments, at least one of the set of conductive feature layout patterns 512 is usable to manufacture one or more of conductive region 230b, conductive structure 212, conductive portion 212a or conductive portion 212b.

Each of the conductive feature layout patterns 512a, 512b, 512c, 512d, 512e, 512f, 512g or 512h of the set of conductive feature layout patterns 512 has a corresponding length in the first direction X, the second direction Y, the fourth direction M or the fifth direction N. In some embodiments, the sum of the corresponding lengths of the set of conductive feature layout patterns 512 is equal to an effective width of the set of conductive feature layout patterns 512.

Set of conductive feature layout patterns 514 includes at least a conductive feature layout pattern 514a. The set of conductive feature layout patterns 514 extends in at least the first direction X or the second direction Y. In some embodiments, conductive feature layout pattern 514a is positioned at a center of the set of conductive feature layout patterns 512.

In some embodiments, the set of conductive feature layout patterns 514 has a shape corresponding to a polygon. In some embodiments, the set of conductive feature layout patterns 514 has an octagonal shape.

In some embodiments, the set of conductive feature layout patterns 514 includes a number of conductive feature layout patterns similar to the conductive feature layout patterns 512a, 512b, 512c, 512d, 512e, 512f, 512g or 512h of the set of conductive feature layout patterns 512. For example, in some embodiments, the set of conductive feature layout patterns 514 has an octagonal shape with an open region in the center.

At least conductive feature layout pattern 514a of the set of conductive feature layout patterns 514 is usable to manufacture corresponding conductive feature 514a' of the set of conductive features 514' of FIG. 5B. At least conductive feature layout pattern 514a of the set of conductive feature layout patterns 514 is usable to manufacture conductive region 230c1 of FIGS. 2A-2B. In some embodiments, at least one of the set of conductive feature layout patterns 514 is usable to manufacture one or more of conductive region 230c, conductive structure 214, conductive portion 214a or conductive portion 214b.

Each of the conductive feature layout patterns 514a of the set of conductive feature layout patterns 514 has a corresponding length in the first direction X or the second direction Y. In some embodiments, the sum of the corresponding lengths of the set of conductive feature layout patterns 514 is equal to an effective width of the set of conductive feature layout patterns 514.

Set of gate layout patterns 532 includes one or more of gate layout patterns 532a, 532b, 532c, 532d, 532e, 532f, 532g or 532h. In some embodiments, gate layout patterns 532a, 532b, 532c, 532d, 532e, 532f, 532g or 532h are coupled together such that the set of gate layout patterns 532 is a continuous layout pattern. In some embodiments, the set of gate layout patterns 532 has a shape corresponding to a polygon. In some embodiments, the set of gate layout patterns 532 has an octagonal shape.

The set of gate layout patterns 532 extend in at least the first direction X, the second direction Y, the fourth direction M or the fifth direction N. Gate layout patterns 532a and 532e extend in the first direction X, gate layout patterns 532c and 532g extend in the second direction Y, gate layout patterns 532b and 532f extend in the fourth direction M, and gate layout patterns 532d and 532h extend in the fifth direction N.

Gate layout patterns 532a and 532e are separated from each other in the second direction Y, gate layout patterns 532c and 532g are separated from each other in the first direction X, gate layout patterns 532b and 532f are separated from each other in the fifth direction N, and gate layout patterns 532d and 532h are separated from each other in the fourth direction M.

In some embodiments, a first end of gate layout pattern 532a contacts a first end of gate layout pattern 532h, and a second end of gate layout pattern 532a contacts a first end of gate layout pattern 532b.

In some embodiments, a first end of gate layout pattern 532e contacts a first end of gate layout pattern 532f, and a second end of gate layout pattern 532e contacts a first end of gate layout pattern 532d.

In some embodiments, a first end of gate layout pattern 532c contacts a second end of gate layout pattern 532d, and a second end of gate layout pattern 532c contacts a second end of gate layout pattern 532b.

In some embodiments, a first end of gate layout pattern 532g contacts a second end of gate layout pattern 532f, and a second end of gate layout pattern 532g contacts a second end of gate layout pattern 532h.

At least one of gate layout patterns 532a, 532b, 532c, 532d, 532e, 532f, 532g or 532h of the set of gate layout patterns 532 is usable to manufacture a corresponding gate 532a', 532b', 532c', 532d', 532e', 532f, 532g' or 532h' of the set of gates 532' of FIG. 5B. At least one of gate layout patterns 532a, 532b, 532c, 532d, 532e, 532f, 532g or 532h of the set of gate layout patterns 532 is usable to manufacture the gate of PMOS transistor P1 of FIG. 1 or gate 232 of FIG. 2A-2B. In some embodiments, at least one of the set of gate layout patterns 532 is usable to manufacture one or more of gate dielectric layer 234, semiconducting layer 236 or hard mask 238.

Each of the gate layout patterns 532a, 532b, 532c, 532d, 532e, 532f, 532g or 532h of the set of gate layout patterns 532 has a corresponding length in the first direction X, the second direction Y, the fourth direction M or the fifth direction N. In some embodiments, the sum of the corresponding lengths of the set of gate layout patterns 532 is equal to an effective gate layout pattern width of the set of gate layout patterns 532.

In some embodiments, the set of conductive feature layout patterns 512 enclose a periphery of the set of conductive feature layout patterns 514. In some embodiments, the set of conductive feature layout patterns 512 are separated from the set of conductive feature layout patterns 514 in at least the first direction X, the second direction Y, the fourth direction M or the fifth direction N a distance D3 (not labelled).

In some embodiments, the set of gate layout patterns 532 enclose a periphery of the set of conductive feature layout patterns 512. In some embodiments, gate layout patterns 532a, 532e of the set of gate layout patterns 532 are separated from corresponding conductive feature layout patterns 512a, 512e of the set of conductive feature layout patterns 512 in the second direction Y by a distance D4 (not labelled).

In some embodiments, gate layout patterns 532b, 532f of the set of gate layout patterns 532 are separated from corresponding conductive feature layout patterns 512b, 512f of the set of conductive feature layout patterns 512 in the fifth direction N by the distance D4 (not labelled).

In some embodiments, gate layout patterns 532c, 532g of the set of gate layout patterns 532 are separated from corresponding conductive feature layout patterns 512c, 512g of the set of conductive feature layout patterns 512 in the first direction X by the distance D4 (not labelled).

In some embodiments, gate layout patterns 532d, 532h of the set of gate layout patterns 532 are separated from corresponding conductive feature layout patterns 512d, 512h of the set of conductive feature layout patterns 512 in the fourth direction M by the distance D4 (not labelled).

In some embodiments, the set of conductive feature layout patterns 510 enclose a periphery of the set of gate layout patterns 532.

In some embodiments, the set of gate layout patterns 532 enclose a periphery of the set of conductive feature layout patterns 512. In some embodiments, gate layout patterns 532a, 532e of the set of gate layout patterns 532 are separated from corresponding conductive feature layout patterns 512a, 512e of the set of conductive feature layout patterns 512 in the second direction Y by a distance D4 (not labelled).

In some embodiments, gate layout patterns 532b, 532f of the set of gate layout patterns 532 are separated from corresponding conductive feature layout patterns 512b, 512f of the set of conductive feature layout patterns 512 in the fifth direction N by the distance D4 (not labelled).

In some embodiments, gate layout patterns 532c, 532g of the set of gate layout patterns 532 are separated from corresponding conductive feature layout patterns 512c, 512g of the set of conductive feature layout patterns 512 in the first direction X by the distance D4 (not labelled).

In some embodiments, gate layout patterns 532d, 532h of the set of gate layout patterns 532 are separated from corresponding conductive feature layout patterns 512d, 512h of the set of conductive feature layout patterns 512 in the fourth direction M by the distance D4 (not labelled).

In some embodiments, the set of conductive feature layout patterns 510 enclose a periphery of the set of gate layout patterns 532.

In some embodiments, conductive feature layout patterns 510a, 510e of the set of conductive feature layout patterns 510 are separated from corresponding gate layout patterns 532a, 532e of the set of gate layout patterns 532 in the second direction Y by a distance D5 (not labelled).

In some embodiments, conductive feature layout patterns 510b, 510f of the set of conductive feature layout patterns 510 are separated from corresponding gate layout patterns 532b, 532f of the set of gate layout patterns 532 in the fifth direction N by the distance D5 (not labelled).

In some embodiments, conductive feature layout patterns 510c, 510g of the set of conductive feature layout patterns 510 are separated from corresponding gate layout patterns 532c, 532g of the set of gate layout patterns 532 in the first direction X by the distance D5 (not labelled).

In some embodiments, conductive feature layout patterns 510d, 510h of the set of conductive feature layout patterns 510 are separated from corresponding gate layout patterns 532d, 532h of the set of gate layout patterns 532 in the fourth direction M by the distance D5 (not labelled).

In some embodiments, at least one of distance D3, D4 or D5 is different from at least another of distance D3, D4 or D5. In some embodiments, at least one of distance D3, D4 or D5 is the same as at least another of distance D3, D4 or D5.

In some embodiments, at least an area of the set of conductive feature layout patterns 510, the set of conductive feature layout patterns 512, the set of conductive feature layout patterns 514 or the set of gate layout patterns 532 is different from at least another area of the set of conductive feature layout patterns 510, the set of conductive feature layout patterns 512, the set of conductive feature layout patterns 514 or the set of gate layout patterns 532.

In some embodiments, at least an area of the set of conductive feature layout patterns 510, the set of conductive feature layout patterns 512, the set of conductive feature layout patterns 514 or the set of gate layout patterns 532 is the same as at least another area of the set of conductive feature layout patterns 510, the set of conductive feature layout patterns 512, the set of conductive feature layout patterns 514 or the set of gate layout patterns 532.

Other configurations or numbers of gate layout patterns in the set of gate layout patterns 532 are within the scope of the present disclosure.

Other configurations or numbers of conductive feature layout patterns in the set of conductive feature layout patterns 510, 512 or 514 are within the scope of the present disclosure.

By having gate layout patterns 532a, 532b, 532c, 532d, 532e, 532f, 532g or 532h of the set of gate layout patterns 532 extend in at least 4 directions (first direction X, second direction Y, fourth direction M and fifth direction N), the effective gate layout pattern width of the set of gate layout patterns 532 is larger than other approaches where the gate layout pattern extends in only a single direction. By having a larger effective gate layout pattern width, layout design 500A is usable to manufacture an integrated circuit 500B with a larger effective gate width resulting in greater electron mobility and therefore higher current driving capability than other approaches.

In some embodiments, by extending each of the set of conductive feature layout patterns 510, a set of conductive feature layout patterns 512, a set of conductive feature layout patterns 514 and set of gate layout patterns 532 in 4 directions (first direction X, second direction Y, fourth direction M and fifth direction N), each of set of conductive feature layout patterns 510, a set of conductive feature layout patterns 512, a set of conductive feature layout patterns 514 and set of gate layout patterns 532 has a larger effective header width than other approaches. In some embodiments, by having a larger effective header width results an increase in the header density of layout design 500A causing a greater electron mobility and therefore a higher driving current capability than other approaches.

FIG. 5B is a top view of a diagram of an integrated circuit 500B, in accordance with some embodiments.

In some embodiments, integrated circuit 500B is manufactured by layout design 500A of FIG. 5A. Structural relationships including at least alignment, lengths and widths, as well as connections and configurations of integrated circuit 500B of FIG. 5B are similar to corresponding structural relationships, corresponding connections and corresponding configurations of layout design 500A of FIG. 5A, and similar detailed description is therefore omitted for the sake of brevity.

Integrated circuit 500B includes set of conductive features 510', set of conductive features 512', set of conductive features 514' and set of gates 532'.

Set of conductive features 510' includes one or more of conductive features 510a', 510b', 510c', 510d', 510e', 510f, 510g' or 510h'. In some embodiments, the set of conductive features 510' are manufactured by the set of conductive feature layout patterns 510 of FIG. 5A.

Set of conductive features 512' includes one or more of conductive features 512a', 512b', 512c', 512d', 512e', 512f, 512g' or 512h'. In some embodiments, the set of conductive features 512' are manufactured by the set of conductive feature layout patterns 512 of FIG. 5A.

Set of conductive features 514' includes one or more of conductive features 514a'. In some embodiments, the set of conductive features 514' are manufactured by the set of conductive feature layout patterns 514 of FIG. 5A.

In some embodiments, the structural relationships, connections and configurations of conductive features 510a', 510b', 510c', 510d', 510e', 510f, 510g', 510h', 512a', 512b', 512c', 512d', 512e', 512f, 512g', 512h' and 514a' are similar to corresponding structural relationships, corresponding connections and corresponding configurations of corresponding conductive feature layout patterns 510a, 510b, 510c, 510d, 510e, 510f, 510g, 510h, 512a, 512b, 512c, 512d, 512e, 512f, 512g, 512h and 514a of FIG. 5A, and similar detailed description is therefore omitted for the sake of brevity.

Set of gates 532' includes one or more of gates 532a', 532b', 532c', 532d', 532e', 532f, 532g' or 532h'. In some embodiments, the set of gates 532' are manufactured by the set of gate layout patterns 532 of FIG. 5A. In some embodiments, the structural relationships, connections and configurations of gates 532a', 532b', 532c', 532d', 532e', 532f, 532g' and 532h' of the set of gates 532' are similar to corresponding structural relationships, corresponding connections and corresponding configurations of corresponding gate layout patterns 532a, 532b, 532c, 532d, 532e, 532f, 532g and 532h of the set of gate layout patterns 532 of FIG. 5A, and similar detailed description is therefore omitted for the sake of brevity.

By having gates 532a', 532b', 532c', 532d', 532e', 532f, 532g' and 532h' of the set of gates 532' extend in at least 4 directions (e.g., first direction X, second direction Y, fourth direction M and fifth direction N), the effective gate width of the set of gates 532' is larger than other approaches where the gate extends in only a single direction. By having a larger effective gate width results in an increase in the header density of integrated circuit 500B causing a greater electron mobility and therefore higher current driving capability than other approaches.

In some embodiments, by extending at least the set of conductive features 510', the set of conductive features 512', the set of conductive features 514' or the set of gates 532' in at least 4 directions (e.g., first direction X, second direction Y, fourth direction M and fifth direction N), causes integrated circuit 500B to have a larger effective header width than other approaches. In some embodiments, by having a larger effective header width results in an increase in the header density of integrated circuit 500B causing a greater electron mobility and therefore a higher driving current capability than other approaches.

Method

Figures 6, 7:
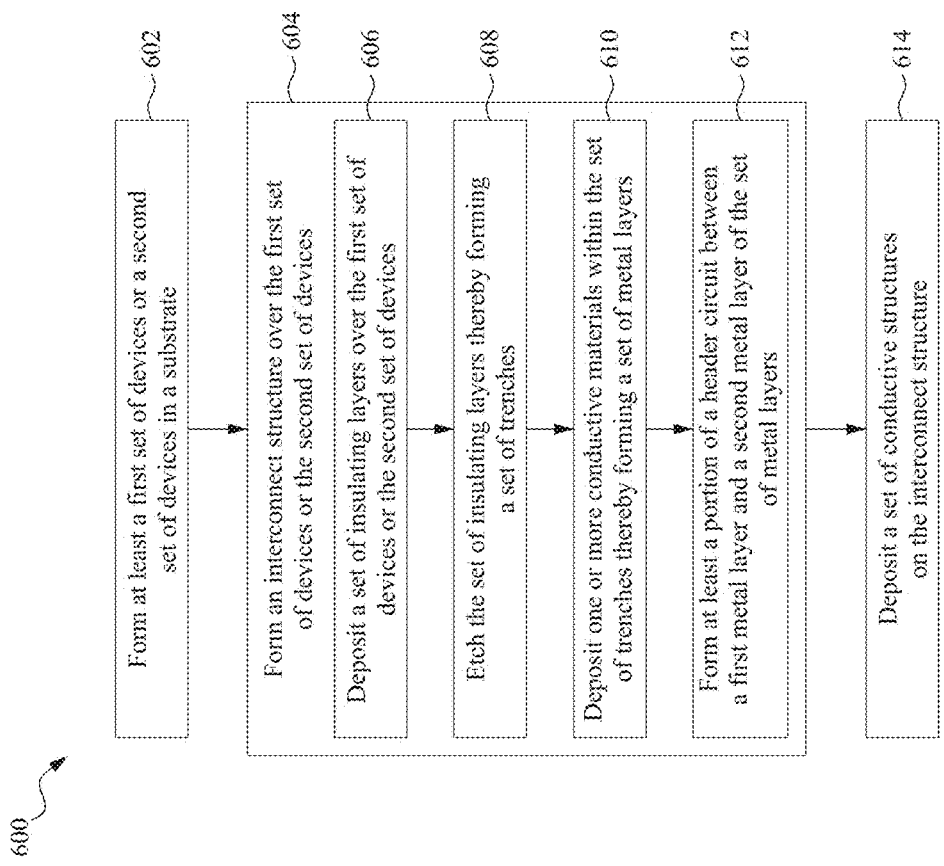
FIG. 6 is a flowchart of a method of forming or manufacturing an integrated circuit in accordance with some embodiments.
FIG. 7 is a flowchart of a method of forming or manufacturing an integrated circuit in accordance with some embodiments.

FIG. 6 is a flowchart of a method 600 of forming or manufacturing an integrated circuit in accordance with some embodiments. It is understood that additional operations may be performed before, during, and/or after the method 600 depicted in FIG. 6, and that some other operations may only be briefly described herein. In some embodiments, the method 600 is usable to form integrated circuits, such as integrated circuit 100 (FIG. 1), integrated circuit 200 (FIG.

2A), integrated circuit 300B (FIG. 3B), integrated circuit 400B (FIG. 4B) or integrated circuit 500B (FIG. 5B). In some embodiments, the method 600 is usable to form integrated circuits having similar structural relationships as one or more of layout design 300A (FIG. 3A), layout design 400A (FIG. 4A) or layout design 500A (FIG. 5A).

In operation 602 of method 600, at least a first set of devices (e.g., gated power circuit 204) or a second set of devices (e.g., ungated power circuit 206) are formed in a substrate. In some embodiments, the first set of devices of method 600 includes gated power circuit 204. In some embodiments, the first set of devices of method 600 includes ungated power circuit 206.

In some embodiments, the first set of devices are configured to operate on the first supply voltage VVDD, and the second set of devices are configured to operate on the second supply voltage TVDD different from the first supply voltage.

In operation 604 of method 600, an interconnect structure (e.g., interconnect 208) is formed over the first set of devices (e.g., gated power circuit 204) or the second set of devices (e.g., ungated power circuit 206). In some embodiments, interconnect structure of method 600 is interconnect 208. In some embodiments, the forming the interconnect structure of operation 604 includes BEOL processing. In some embodiments, the forming the interconnect structure of operation 604 comprises one or more of operations 606, 608, 610 or 612. In some embodiments, the interconnect structure is formed by one or more single or dual damascene processes. In some embodiments, the interconnect structure is formed by one or more photolithography processes.

In operation 606 of method 600, a set of insulating layers are deposited over the first set of devices or the second set of devices. In some embodiments, the set of insulating layers of method 600 includes one or more of ILD 220, ILD 222 or capping layer 240.

In some embodiments, the insulating layers of operation 606 are deposited by one or more photolithography processes. In some embodiments, the photolithography processes include patterning a photoresist, such as a positive photoresist or a negative photoresist. In some embodiments, the photolithography process includes forming a hard mask, an antireflective structure, or another suitable photolithography structure. In some embodiments, the insulating layers of operation 606 are deposited by CVD, PVD, spin coating or other suitable processes.

In operation 608 of method 600, the set of insulating layers are etched thereby forming a set of trenches. In some embodiments, the etching process of operation 608 includes a wet etching process, a dry etching process, a reactive ion etching (RIE) process, or another suitable etching process.

In operation 610 of method 600, at least a conductive material is depositing within the set of trenches, thereby forming a set of metal layers. In some embodiments, at least a trench of the set of trenches or openings are filled with a conductive material, e.g., copper, aluminum, titanium, nickel, tungsten, or other suitable conductive material. In some embodiments, the set of trenches or openings are filled using electroplating, CVD, PVD, sputtering, atomic layer deposition (ALD) or other suitable formation process. In some embodiments, operation 610 of method 600 further includes removing the at least one conductive material that protrudes from the one or more trenches.

In operation 612 of method 600, at least a portion of a header circuit 202 is formed between a first metal layer and a second metal layer of the set of metal layers. In some embodiments, the portion of the header circuit extends in a first direction and a second direction different from the first direction. In some embodiments, the set of metal layers of method 600 is one or more metallization layers M0, . . . , Mx−1, Mx. In some embodiments, the first metal layer of method 600 is Mx, and the second metal layer of method 600 is Mx−1. Other metal layers are within the scope of the present disclosure. In some embodiments, the header circuit 202 is coupled to the second voltage supply having the second supply voltage TVDD, and is configured to provide the first supply voltage VVDD to the first set of devices.

In some embodiments, the forming at least the portion of the header circuit of operation 612 comprises one or more of operations 612*a*, 612*b*, 612*c*, 612*d*, 612*e*, 612*f* or 612*g* (not shown).

In operation 612*a* of method 600, a first conductive portion 232 is deposited within a trench (e.g., region between ILD 222*b* and ILD 222*b*) of the set of trenches thereby forming a gate of the header circuit 202. In some embodiments, the gate of method 600 includes one or more gates of the set of gates 332', 432' or 532' or gate 232. In some embodiments, the trench of the set of trenches or openings is filled with a conductive material, e.g., copper, aluminum, titanium, nickel, tungsten, or other suitable conductive material. In some embodiments, the set of trenches or openings are filled using electroplating, CVD, PVD, sputtering, atomic layer deposition (ALD) or other suitable formation process. In some embodiments, operation 612*a* of method 600 further includes removing the at least one conductive material that protrudes from the one or more trenches.

In operation 612*b* of method 600, a dielectric layer is deposited on the gate. In some embodiments, the dielectric layer of operation 612 includes a capping layer 240*c*1. In some embodiments, the dielectric layer is deposited on the gate by CVD, PVD, spin coating or other suitable processes.

In operation 612*c* of method 600, a gate dielectric layer 234 is deposited on the dielectric layer. In some embodiments, the gate dielectric layer 234 is deposited on the dielectric layer by CVD, PVD, spin coating or other suitable processes.

In operation 612*d* of method 600, a semiconducting layer 236 is deposited on the gate dielectric layer 234. In some embodiments, the semiconducting layer 236 is deposited on the gate dielectric layer 234 by sputtering, pulsed laser deposition of PVD, spin coating, PVD or other suitable processes.

In operation 612*e* of method 600, a hard mask layer 238 is deposited on the semiconducting layer 236. In some embodiments, the hard mask layer 238 is deposited by CVD, PVD, laser or electron beam evaporation, or other suitable processes.

In operation 612*f* of method 600, a second conductive portion (e.g., conductive region 230*a*1) is deposited above a first portion of the dielectric layer (e.g., capping layer 240*c*1) thereby forming a source terminal of the header circuit. In some embodiments, the source terminal is part of a first portion of the first metal layer of the set of metal layers, and is coupled to the second supply voltage.

In operation 612*g* of method 600, a third conductive portion (e.g., conductive region 230*b*1) is deposited above a second portion of the dielectric layer (e.g., capping layer 240*c*1) thereby forming a drain terminal of the header circuit. In some embodiments, the drain terminal is part of a second portion of the first metal layer of the set of metal layers. In some embodiments, the drain terminal is coupled to at least the first set of devices, and configured to provide the first supply voltage to at least the first set of devices.

In some embodiments, at least the deposition of the second conductive portion of operation 612f or the third conductive portion of operation 612g is performed in a manner similar to operation 612a, e.g., using electroplating, CVD, PVD, sputtering, atomic layer deposition (ALD) or other suitable formation process.

In operation 614 of method 600, a set of conductive structures are deposited on the interconnect structure. In some embodiments, the set of conductive structures are electrically coupled to at least the first set of devices or the second set of devices. In some embodiments, the set of conductive structures of method 600 include at least conductive structure 210, conductive structure 212 or conductive structure 214. In some embodiments, the depositing the set of conductive structures on the interconnect structure of operation 614 includes BEOL processing.

In some embodiments, operation 614 of method 600 further includes one or more of depositing a first conductive structure, depositing a second conductive structure or depositing a third conductive structure. In some embodiments, the first conductive structure (e.g., conductive structure 210) is electrically coupled to at least the first set of devices and the source of the header circuit 202. In some embodiments, the second conductive structure (e.g., conductive structure 212) is electrically coupled to at least the second set of devices and the drain of the header circuit 202. In some embodiments, the third conductive structure (e.g., conductive structure 214) is electrically coupled to at least the second set of devices and a reference voltage supply VSS. In some embodiments, operation 614 is performed in a manner similar to operation 612a, e.g., using electroplating, CVD, PVD, sputtering, atomic layer deposition (ALD) or other suitable formation process. In some embodiments, one or more of operations 602, 604, 606, 608, 610, 612 or 614 is not performed.

FIG. 7 is a flowchart of a method 700 of forming or manufacturing an integrated circuit in accordance with some embodiments. It is understood that additional operations may be performed before, during, and/or after the method 700 depicted in FIG. 7, and that some other operations may only be briefly described herein. In some embodiments, the method 700 is usable to form integrated circuits, such as integrated circuit 100 (FIG. 1), 200 (FIG. 2A), 300B FIG. 3B), 400B (FIG. 4B) or 500B (FIG. 5B). In some embodiments, the method 700 is usable to form integrated circuits having similar structural relationships as one or more of layout design 300A (FIG. 3A), 400A (FIG. 4A) or 500A (FIG. 5A).

In operation 702 of method 700, a layout design of an integrated circuit is generated. Operation 702 is performed by a processing device (e.g., processor 902 (FIG. 9)) configured to execute instructions for generating a layout design. In some embodiments, the layout design of method 700 includes one or more of layout design 300A, 400A or 500A. In some embodiments, the layout design of the present application is in a graphic database system (GDSII) file format.

In operation 704 of method 700, the integrated circuit is manufactured based on the layout design. In some embodiments, operation 704 of method 700 comprises manufacturing at least one mask based on the layout design, and manufacturing the integrated circuit based on the at least one mask. In some embodiments, operation 704 of method 700 comprises manufacturing the integrated circuit based on one or more operations of method 600 (FIG. 6).

Figure 8:
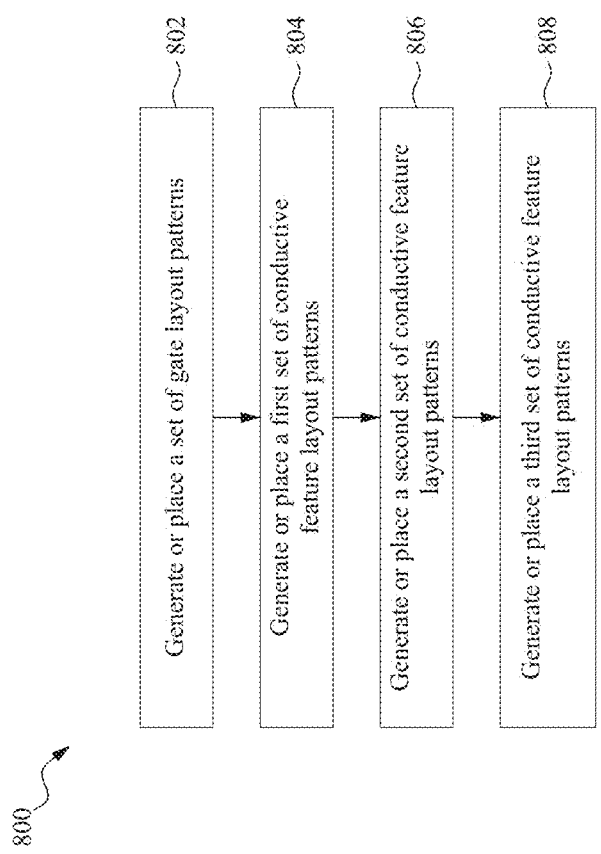
FIG. 8 is a flowchart of a method of generating a layout design of an integrated circuit in accordance with some embodiments.

FIG. 8 is a flowchart of a method 800 of generating a layout design of an integrated circuit in accordance with some embodiments. It is understood that additional operations may be performed before, during, and/or after the method 800 depicted in FIG. 8, and that some other processes may only be briefly described herein. In some embodiments, the method 800 is usable to generate one or more layout patterns of layout design 300A (FIG. 3A), 400A (FIG. 4A) or 500A (FIG. 5A) of an integrated circuit (e.g., integrated circuit 100, 200, 300B, 400B or 500B).

In operation 802 of method 800, a set of gate layout patterns is generated or placed on layout design 300A, 400A or 500A. In some embodiments, the set of gate layout patterns of method 800 includes at least portions of one or more layout patterns of the set of gate layout patterns 332, 432 or 532.

In operation 804 of method 800, a first set of conductive feature layout patterns is generated or placed on layout design 300A, 400A or 500A. In some embodiments, the first set of conductive feature layout patterns of method 800 includes at least portions of one or more layout patterns of the set of conductive feature layout patterns 310, 410 or 510.

In operation 806 of method 800, a second set of conductive feature layout patterns is generated or placed on layout design 300A, 400A or 500A. In some embodiments, the second set of conductive feature layout patterns of method 800 includes at least portions of one or more layout patterns of the set of conductive feature layout patterns 312, 412 or 512.

In operation 808 of method 800, a third set of conductive feature layout patterns is generated or placed on layout design 300A, 400A or 500A. In some embodiments, the third set of conductive feature layout patterns of method 800 includes at least portions of one or more layout patterns of the set of conductive feature layout patterns 314, 414 or 514.

In some embodiments, one or more of operations 802, 804, 806 or 808 is not performed. One or more of the operations of methods 700-800 is performed by a processing device configured to execute instructions for manufacturing an integrated circuit, such as integrated circuit 100, 200, 300B, 400B or 500B. In some embodiments, one or more operations of methods 700-800 is performed using a same processing device as that used in a different one or more operations of methods 700-800. In some embodiments, a different processing device is used to perform one or more operations of methods 700-800 from that used to perform a different one or more operations of methods 700-800.

Figure 9:
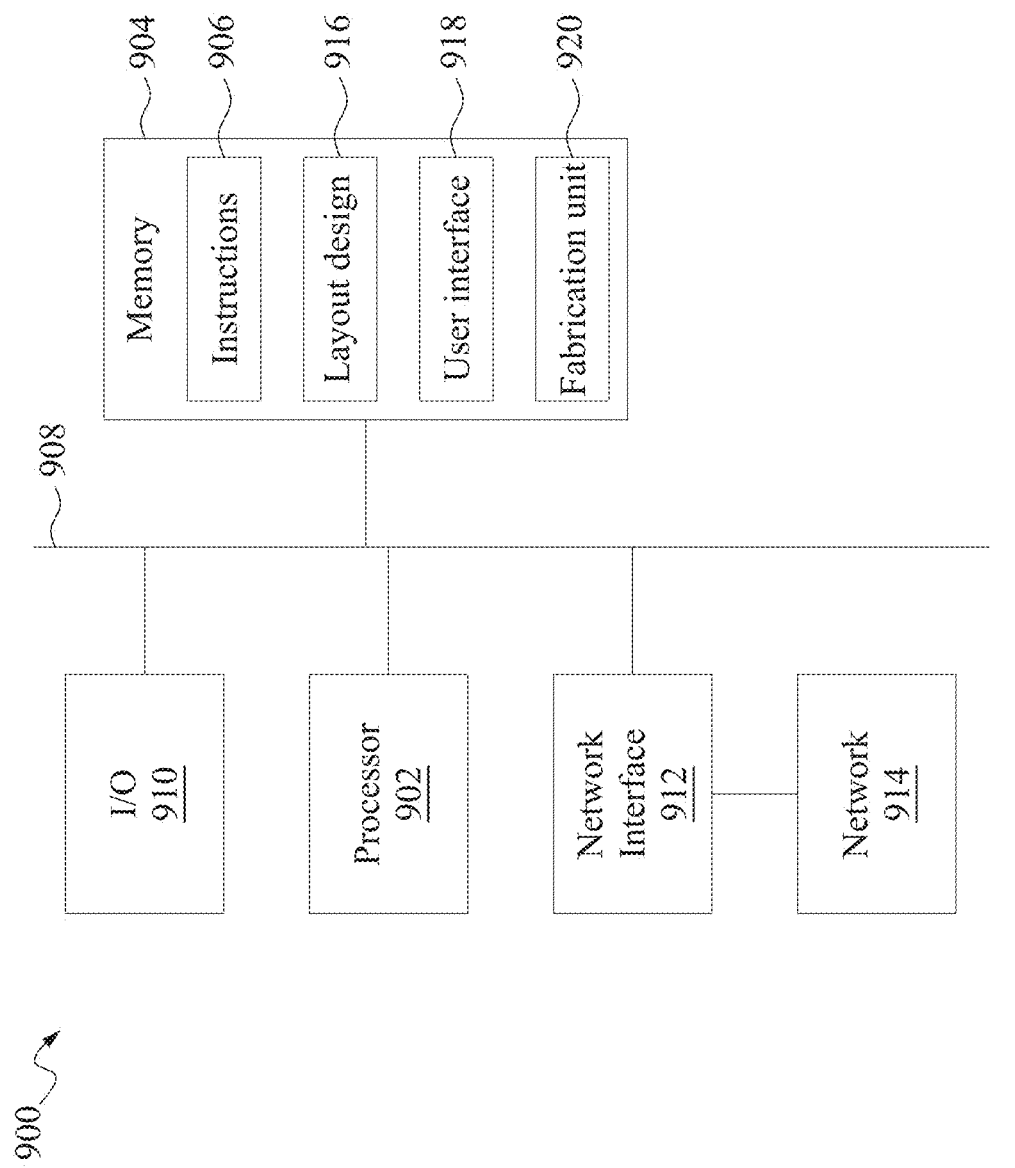
FIG. 9 is a schematic view of a system for designing and manufacturing an IC layout design in accordance with some embodiments.

FIG. 9 is a schematic view of a system 900 for designing and manufacturing an IC layout design in accordance with some embodiments. In some embodiments, system 900 generates or places one or more IC layout designs described herein. In some embodiments, system 900 manufactures one or more ICs based on the one or more IC layout designs described herein. System 900 includes a hardware processor 902 and a non-transitory, computer readable storage medium 904 encoded with, i.e., storing, the computer program code 906, i.e., a set of executable instructions. Computer readable storage medium 904 is configured for interfacing with manufacturing machines for producing the integrated circuit. The processor 902 is electrically coupled to the computer readable storage medium 904 by a bus 908. The processor 902 is also electrically coupled to an I/O interface 910 by bus 908. A network interface 912 is also electrically coupled to the processor 902 by bus 908. Network interface 912 is coupled to a network 914, so that processor 902 and computer readable storage medium 904 are capable of connecting to external elements via network 914. The processor 902 is configured to execute the computer program code 906 encoded in the computer readable storage medium 904 in order to cause system 900 to be usable for performing a portion or all of the operations as described in method 700 or 800.

In some embodiments, the processor 902 is a central processing unit (CPU), a multi-processor, a distributed processing system, an application specific integrated circuit (ASIC), and/or a suitable processing unit.

In some embodiments, the computer readable storage medium 904 is an electronic, magnetic, optical, electromagnetic, infrared, and/or a semiconductor system (or apparatus or device). For example, the computer readable storage medium 904 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 904 includes a compact disk-read only memory (CD-ROM), a compact disk-read/write (CD-R/W), and/or a digital video disc (DVD).

In some embodiments, the storage medium 904 stores the computer program code 906 configured to cause system 900 to perform method 700 or 800. In some embodiments, the storage medium 904 also stores information needed for performing method 700 or 800 as well as information generated during performance of method 700 or 800, such as layout design 916 and user interface 918 and fabrication unit 920, and/or a set of executable instructions to perform the operation of method 700 or 800. In some embodiments, layout design 916 comprises one or more layout patterns of layout design 300A, 400A or 500A.

In some embodiments, the storage medium 904 stores instructions (e.g., computer program code 906) for interfacing with manufacturing machines. The instructions (e.g., computer program code 906) enable processor 902 to generate manufacturing instructions readable by the manufacturing machines to effectively implement method 700 or 800 during a manufacturing process.

System 900 includes I/O interface 910. I/O interface 910 is coupled to external circuitry. In some embodiments, I/O interface 910 includes a keyboard, keypad, mouse, trackball, trackpad, and/or cursor direction keys for communicating information and commands to processor 902.

System 900 also includes network interface 912 coupled to the processor 902. Network interface 912 allows system 900 to communicate with network 914, to which one or more other computer systems are connected. Network interface 912 includes wireless network interfaces such as BLUETOOTH, WIFI, WIMAX, GPRS, or WCDMA; or wired network interface such as ETHERNET, USB, or IEEE-1394. In some embodiments, method 700 or 800 is implemented in two or more systems 900, and information such as layout design, user interface and fabrication unit are exchanged between different systems 900 by network 914.

System 900 is configured to receive information related to a layout design through I/O interface 910 or network interface 912. The information is transferred to processor 902 by bus 908 to determine a layout design for producing an IC (e.g., integrated circuit 100, 200, 300B, 400B or 500B). The layout design is then stored in computer readable medium 904 as layout design 916. System 900 is configured to receive information related to a user interface through I/O interface 910 or network interface 912. The information is stored in computer readable medium 904 as user interface 918. System 900 is configured to receive information related to a fabrication unit through I/O interface 910 or network interface 912. The information is stored in computer readable medium 904 as fabrication unit 920. In some embodiments, the fabrication unit 920 includes fabrication information utilized by system 900.

In some embodiments, method 700 or 800 is implemented as a standalone software application for execution by a processor. In some embodiments, method 700 or 800 is implemented as a software application that is a part of an additional software application. In some embodiments, method 700 or 800 is implemented as a plug-in to a software application. In some embodiments, method 700 or 800 is implemented as a software application that is a portion of an EDA tool. In some embodiments, method 700 or 800 is implemented as a software application that is used by an EDA tool. In some embodiments, the EDA tool is used to generate a layout design of the integrated circuit device. In some embodiments, the layout design is stored on a non-transitory computer readable medium. In some embodiments, the layout design is generated using a tool such as VIRTUOSO® available from CADENCE DESIGN SYSTEMS, Inc., or another suitable layout generating tool. In some embodiments, the layout design is generated based on a netlist which is created based on the schematic design. In some embodiments, method 700 or 800 is implemented by a manufacturing device to manufacture an integrated circuit using a set of masks manufactured based on one or more layout designs generated by system 900. In some embodiments, system 900 is a manufacturing device to manufacture an integrated circuit using a set of masks manufactured based on one or more layout designs of the present disclosure. In some embodiments, system 900 of FIG. 9 generates layout designs of an IC that are smaller than other approaches. In some embodiments, system 900 of FIG. 9 generates layout designs of an IC (e.g., integrated circuit 100, 200, 300B, 400B or 500B) that occupy less area than other approaches.

Figure 10:
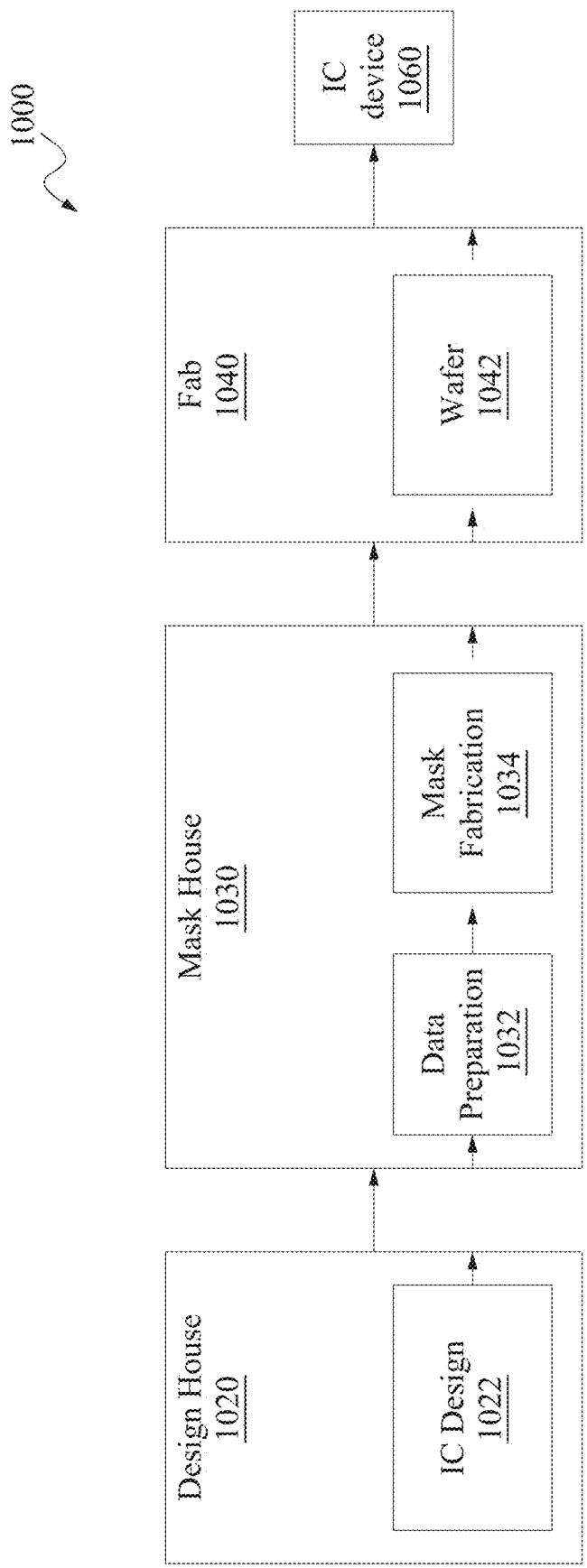
FIG. 10 is a block diagram of an IC manufacturing system, and an IC manufacturing flow associated therewith, in accordance with at least one embodiment of the present disclosure.

FIG. 10 is a block diagram of an integrated circuit (IC) manufacturing system 1000, and an IC manufacturing flow associated therewith, in accordance with at least one embodiment of the present disclosure.

In FIG. 10, IC manufacturing system 1000 includes entities, such as a design house 1020, a mask house 1030, and an IC manufacturer/fabricator ("fab") 1040, that interact with one another in the design, development, and manufacturing cycles and/or services related to manufacturing an IC device 1060. The entities in system 1000 are coupled by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and IC fab 1040 is owned by a single larger company. In some embodiments, two or more of design house 1020, mask house 1030, and IC fab 1040 coexist in a common facility and use common resources.

Design house (or design team) 1020 generates an IC design layout 1022. IC design layout 1022 includes various geometrical patterns designed for an IC device 1060. The geometrical patterns correspond to patterns of metal, oxide, or semiconductor layers that make up the various components of IC device 1060 to be fabricated. The various layers combine to form various IC features. For example, a portion of IC design layout 1022 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 1020 implements a proper design procedure to form IC design layout 1022. The design procedure includes one or more of logic design, physical design or place and route. IC design layout 1022 is presented in one or more data files having information of the geometrical patterns. For example, IC design layout 1022 can be expressed in a GDSII file format or DFII file format.

Mask house 1030 includes data preparation 1032 and mask fabrication 1034. Mask house 1030 uses IC design layout 1022 to manufacture one or more masks to be used for fabricating the various layers of IC device 1060 according to IC design layout 1022. Mask house 1030 performs mask data preparation 1032, where IC design layout 1022 is translated into a representative data file ("RDF"). Mask data preparation 1032 provides the RDF to mask fabrication 1034. Mask fabrication 1034 includes a mask writer. A mask writer converts the RDF to an image on a substrate, such as a mask (reticle) or a semiconductor wafer. The design layout is manipulated by mask data preparation 1032 to comply with particular characteristics of the mask writer and/or requirements of IC fab 1040. In FIG. 10, mask data preparation 1032 and mask fabrication 1034 are illustrated as separate elements. In some embodiments, mask data preparation 1032 and mask fabrication 1034 can be collectively referred to as mask data preparation.

In some embodiments, mask data preparation 1032 includes optical proximity correction (OPC) which uses lithography enhancement techniques to compensate for image errors, such as those that can arise from diffraction, interference, other process effects and the like. OPC adjusts IC design layout 1022. In some embodiments, mask data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1032 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1034, which may undo part of the modifications performed by OPC in order to meet mask creation rules.

In some embodiments, mask data preparation 1032 includes lithography process checking (LPC) that simulates processing that will be implemented by IC fab 1040 to fabricate IC device 1060. LPC simulates this processing based on IC design layout 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 1022.

It should be understood that the above description of mask data preparation 1032 has been simplified for the purposes of clarity. In some embodiments, data preparation 1032 includes additional features such as a logic operation (LOP) to modify the IC design layout according to manufacturing rules. Additionally, the processes applied to IC design layout 1022 during data preparation 1032 may be executed in a variety of different orders.

After mask data preparation 1032 and during mask fabrication 1034, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by mask fabrication 1034 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1040 is an IC fabrication entity that includes one or more manufacturing facilities for the fabrication of a variety of different IC products. In some embodiments, IC Fab 1040 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 1040 uses the mask (or masks) fabricated by mask house 1030 to fabricate IC device 1060. Thus, IC fab 1040 at least indirectly uses IC design layout 1022 to fabricate IC device 1060. In some embodiments, a semiconductor wafer 1042 is fabricated by IC fab 1040 using the mask (or masks) to form IC device 1060. Semiconductor wafer 1042 includes a silicon substrate or other proper substrate having material layers formed thereon. Semiconductor wafer further includes one or more of various doped regions, dielectric features, multilevel interconnects, and the like (formed at subsequent manufacturing steps).

System 1000 is shown as having design house 1020, mask house 1030 or IC fab 1040 as separate components or entities. However, it is understood that one or more of design house 1020, mask house 1030 or IC fab 1040 are part of the same component or entity.

Details regarding an integrated circuit (IC) manufacturing system (e.g., system 1000 of FIG. 10), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20100040838, published Feb. 6, 2014, and U.S. Pat. No. 7,260,442, granted Aug. 21, 2007, the entireties of each of which are hereby incorporated by reference.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

One aspect of this description relates to an integrated circuit. In some embodiments, the integrated circuit includes a first set of devices, a set of metal layers and a header circuit. In some embodiments, the first set of devices is configured to operate on a first supply voltage, and is located on a first layer of the integrated circuit. In some embodiments, the set of metal layers is above the first layer. In some embodiments, the set of metal layers includes a first metal layer and a second metal layer. In some embodiments, the first metal layer extends in at least a first direction and a second direction different from the first direction. In some embodiments, the header circuit is above the first set of devices. In some embodiments, at least a portion of the header circuit is positioned between the first metal layer and the second metal layer. In some embodiments, the header circuit is configured to be coupled to a first voltage supply having the first supply voltage, and is configured to provide the first supply voltage to the first set of devices. In some embodiments, the integrated circuit further includes a second set of devices configured to operate on the first supply voltage, being located on the first layer of the integrated circuit and being coupled to the first voltage supply. In some embodiments, the first set of devices correspond to a first set of front end of line (FEOL) devices, the second set of devices correspond to a second set of FEOL devices, and the header circuit corresponds to a set of back end of line (BEOL) devices. In some embodiments, the second set of devices includes a header control circuit adjacent to the first set of devices, coupled to the header circuit, and configured to generate a control signal. In some embodiments, the integrated circuit further includes an interconnect coupled between the first set of devices and the second voltage supply. In some embodiments, the interconnect is configured to provide an electrical connection between the first set of devices and the header circuit. In some embodiments, the interconnect includes the set of metal layers embedded in one or more layers of a dielectric material. In some embodiments, the first metal layer of the set of metal layers corresponds to a topmost metal layer, the second metal layer of the set of metal layers is adjacent to the topmost metal layer. In some embodiments, the one or more layers of the dielectric material includes at least one material selected from the group consisting of SiN, SiCN, and mixtures thereof. In some embodiments, the set of metals layers includes one or more layers including at least one material selected from the group consisting of Al, Cu, W, Ti, Ta, TiN, TaN, NiSi, CoSi, and mixtures thereof. In some embodiments, the header circuit includes a transistor. In some embodiments, the transistor includes a gate corresponding to a portion of the second metal layer of the set of metal layers, a source coupled to the first supply voltage, and a drain coupled to the first set of devices, and configured to provide the first supply voltage to the first set of devices. In some embodiments, the gate is configured to receive a control signal from a control circuit. In some embodiments, the header circuit further includes a dielectric layer between the gate and the first metal layer of the set of metal layers, a gate dielectric layer above the dielectric layer, a semiconducting layer above the gate dielectric layer, and a hard mask layer over the channel layer. In some embodiments, the dielectric layer includes at least one selected from the group consisting of SiN, SiCN, and mixtures thereof. In some embodiments, the gate dielectric layer includes at least one material selected from the group consisting of $SiO_2$, $Al_2O_3$ and mixtures thereof. In some embodiments, the semiconducting layer includes at least one material selected from the group consisting of ZnO, In—Ga—Zn—O and mixtures thereof. In some embodiments, the hard mask layer includes at least one material selected from the group consisting of $SiO_2$, $Si_3N_4$ and mixtures thereof.

Another aspect of this description relates to an integrated circuit. In some embodiments, the integrated circuit includes a first set of devices, a second set of devices and an interconnect. In some embodiments, the first set of devices is configured to operate on a first supply voltage, and is located on a first layer of the integrated circuit. In some embodiments, the second set of devices is configured to operate on the first supply voltage, and is located on the first layer of the integrated circuit. In some embodiments, the interconnect is coupled to the first set of devices and the second set of devices. In some embodiments, the interconnect includes a header switch above the first layer. In some embodiments, the header switch is coupled to a first voltage supply having the first supply voltage, and is configured to provide the first supply voltage to the first set of devices. In some embodiments, the header switch includes a gate region. In some embodiments, the gate region extends in at least a first direction and a second direction different from the first direction. In some embodiments, the gate region includes a first portion, a second portion, a third portion, a fourth portion and a fifth portion. In some embodiments, the first portion extends in the first direction. In some embodiments, the second portion extends in the first direction and is separated from the first portion in at least the second direction. In some embodiments, the third portion extends in the second direction and is coupled between a first end of the first portion and a first end of the second portion. In some embodiments, the fourth portion extends in the first direction, and is separated from the first portion in the first direction, and is separated from the third portion in at least the second direction. In some embodiments, the fifth portion extends in the second direction and is coupled between a second end of the second portion and a first end of the fourth portion. In some embodiments, the interconnect includes a first conductive region, a second conductive region and a third conductive region. In some embodiments, the first conductive region is coupled to the second voltage supply and a source of the header switch, and extends in at least the first direction and the second direction. In some embodiments, the second conductive region is coupled to the second voltage supply and a drain of the header switch, and extends in at least the first direction and the second direction. In some embodiments, the third conductive region is coupled to a reference voltage supply and the first set of devices and the second set of devices, and extends in at least the first direction and the second direction. In some embodiments, the gate region is between the first conductive region and the second conductive region, and the second conductive region is between the third conductive region and the gate region. In some embodiments, the first conductive region includes a first conductive portion extending in the first direction and a first set of conductive portions coupled to the first conductive portion. In some embodiments, a first segment of the first set of conductive portions extends in the second direction, and a second segment of the first set of conductive portions extends in a third direction opposite from the second direction. In some embodiments, the first segment of the first set of conductive portions is separated from the second segment of the first set of conductive portions in the first direction. In some embodiments, the third conductive region includes a second conductive portion extending in the first direction and a second set of conductive portions coupled to the second conductive portion. In some embodiments, a first segment of the second set of conductive portions extends in the second direction. In some embodiments, a second segment of the second set of conductive portions extends in the third direction. In some embodiments, the first segment of the second set of conductive portions is separated from the second segment of the second set of conductive portions in the first direction. In some embodiments, the second conductive region includes a first conductive portion, a second conductive portion, a third conductive portion, a fourth conductive portion and a fifth conductive portion. In some embodiments, the first conductive portion extends in the first direction. In some embodiments, the second conductive portion extends in the first direction and is separated from the first conductive portion in at least the second direction. In some embodiments, the third conductive portion extends in the second direction and is coupled between a first end of the first conductive portion and a first end of the second conductive portion. In some embodiments, the fourth conductive portion extends in the first direction, is separated from the first conductive portion in the first direction, and is separated from the third conductive portion in at least the second direction. In some embodiments, the fifth conductive portion extends in the second direction and is coupled between a second end of the second conductive portion and a first end of the fourth conductive portion. In some embodiments, the first conductive region, the second conductive region or the gate region includes a first conductive portion, a second conductive portion, a third conductive portion and a fourth conductive portion. In some embodiments, the first conductive portion extends in the first direction. In some embodiments, the second conductive portion extends in the first direction and is separated from the first conductive portion in the second direction. In some embodiments, the third conductive portion extends in the second direction and is coupled between a first end of the first conductive portion and a first end of the second conductive portion. In some embodiments, the fourth conductive portion extends in the second direction, is separated from the third conductive portion in the first direction, and is coupled between a second end of the first conductive portion and a second end of the second conductive portion. In some embodiments, the third conductive region includes a fifth conductive portion. In some embodiments, at least the first conductive region, the second conductive region, the third conductive region or the gate region has a rectangular shape. In some embodiments, the second conductive region encloses a periphery of the third conductive region. In some embodiments, the gate region encloses a periphery of the second conductive region. In some embodiments, the first conductive region encloses a periphery of the gate region. In some embodiments, the third conductive region is positioned at a center of each of the second conductive region, the gate region and the first conductive region. In some embodiments, at least the first conductive region, the second conductive region, the third conductive region or the gate region has an octagonal shape.

Still another aspect of this description relates to a method of forming an integrated circuit. In some embodiments, the method includes forming at least a first set of devices or a second set of devices in a substrate, forming an interconnect structure over the first set of devices or the second set of devices, and depositing a set of conductive structures on the interconnect structure. In some embodiments, the first set of devices is configured to operate on a first supply voltage, and the second set of devices is configured to operate on the first supply voltage. In some embodiments, the forming the interconnect structure includes depositing a set of insulating layers over the first set of devices or the second set of devices, etching the set of insulating layers thereby forming a set of trenches, depositing at least a conductive material within the set of trenches, thereby forming a set of metal layers, and forming at least a portion of a header circuit between a first metal layer and a second metal layer of the set of metal layers. In some embodiments, the portion of the header circuit extends in a first direction and a second direction different from the first direction. In some embodiments, the header circuit is configured to be coupled to a first voltage supply having the first supply voltage, and is configured to provide the first supply voltage to the first set of devices. In some embodiments, the set of conductive structures is electrically coupled to at least the first set of devices or the second set of devices. In some embodiments, forming at least a portion of the header circuit further includes depositing a first conductive portion within a trench of the set of trenches thereby forming a gate of the header circuit, the gate being part of a portion of the second metal layer of the set of metal layers, and the gate extending in at least the first direction and the second direction different from the first direction. In some embodiments, forming at least a portion of the header circuit further includes depositing a dielectric layer on the gate, depositing a gate dielectric layer on the dielectric layer, depositing a semiconducting layer on the gate dielectric layer and depositing a hard mask layer on the semiconducting layer. In some embodiments, forming at least a portion of the header circuit further includes depositing a second conductive portion above a first portion of the dielectric layer thereby forming a source terminal of the header circuit, the source terminal being part of a first portion of the first metal layer of the set of metal layers, and being coupled to the first supply voltage. In some embodiments, forming at least a portion of the header circuit further includes depositing a third conductive portion above a second portion of the dielectric layer thereby forming a drain terminal of the header circuit, the drain terminal being part of a second portion of the first metal layer of the set of metal layers, the drain terminal being coupled to at least the first set of devices, and being configured to provide the first supply voltage to at least the first set of devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
a first set of devices configured to operate on a first supply voltage, and being located on a first layer of the integrated circuit;
a set of metal layers above the first layer, the set of metal layers comprising a first metal layer and a second metal layer, the first metal layer extending in at least a first direction and a second direction different from the first direction;
a header circuit above the first set of devices, at least a portion of the header circuit being positioned between the first metal layer and the second metal layer, the header circuit configured to be coupled to the first supply voltage, and configured to provide the first supply voltage to the first set of devices; and
a second set of devices configured to operate on the first supply voltage, being located on the first layer of the integrated circuit and being coupled to the first supply voltage,
wherein the first set of devices corresponds to a first set of front end of line (FEOL) devices, the second set of devices corresponds to a second set of FEOL devices, and the header circuit corresponds to a set of back end of line (BEOL) devices.

2. The integrated circuit of claim 1, wherein the second set of devices comprises:
a header control circuit adjacent to the first set of devices, coupled to the header circuit, and configured to generate a control signal.

3. The integrated circuit of claim 2, wherein
the first metal layer of the set of metal layers corresponds to a topmost metal layer; and
the second metal layer of the set of metal layers is adjacent to the topmost metal layer.

4. The integrated circuit of claim 1, further comprising:
an interconnect coupled between the first set of devices and the first supply voltage, the interconnect being configured to provide an electrical connection between the first set of devices and the header circuit, and the interconnect including the set of metal layers embedded in one or more layers of a dielectric material.

5. The integrated circuit of claim 4, wherein
the one or more layers of the dielectric material include at least one material selected from the group consisting of SiN, SiCN, and mixtures thereof; and
the set of metal layers include one or more layers including at least one material selected from the group consisting of Al, Cu, W, Ti, Ta, TiN, TaN, NiSi, CoSi, and mixtures thereof.

6. The integrated circuit of claim 1, wherein the header circuit comprises:
a transistor comprising:
a gate being a portion of the second metal layer of the set of metal layers, the gate being configured to receive a control signal from a control circuit;
a source coupled to the first supply voltage; and
a drain coupled to the first set of devices, and configured to provide the first supply voltage to the first set of devices.

7. The integrated circuit of claim 6, wherein the header circuit further comprises:
a dielectric layer between the gate and the first metal layer of the set of metal layers;
a gate dielectric layer above the dielectric layer;
a semiconducting layer above the gate dielectric layer; and
a hard mask layer over the semiconducting layer.

8. The integrated circuit of claim 7, wherein
the dielectric layer includes at least one selected from the group consisting of SiN, SiCN, and mixtures thereof;
the gate dielectric layer includes at least one material selected from the group consisting of $SiO_2$, $Al_2O_3$ and mixtures thereof;
the semiconducting layer includes at least one material selected from the group consisting of ZnO, In—Ga—Zn—O and mixtures thereof; and
the hard mask layer includes at least one material selected from the group consisting of $SiO_2$, $Si_3N_4$ and mixtures thereof.

9. The integrated circuit of claim 1, further comprising:
a first conductive line extending in at least the first direction or the second direction, and being coupled to the first supply voltage and a source region of the header circuit;
a second conductive line extending in at least the first direction or the second direction, and being coupled to at least a drain region of the header circuit;
a third conductive line extending in at least the first direction or the second direction, and being coupled to a reference supply voltage and at least the first set of devices; and
a gate region of the header circuit extending in at least the first direction and the second direction, the gate region being between the first conductive line and the second conductive line.

10. An integrated circuit comprising:
a first set of devices configured to operate on a first supply voltage, and being located on a first layer of the integrated circuit;
a first set of metal layers above the first layer, the first set of metal layers comprising a first metal layer and a second metal layer, the first metal layer extending in at least a first direction and a second direction different from the first direction;
a second set of metal layers below the first set of metal layers and above the first layer, the second set of metal layers extending in at least the first direction and the second direction;
a header switch above at least the second set of metal layers, at least a portion of the header switch being positioned between the first metal layer and the second metal layer, the header switch being coupled to the first supply voltage, and configured to provide the first supply voltage to the first set of devices; and
a second set of devices configured to operate on the first supply voltage, being located on the first layer of the integrated circuit and being coupled to the first supply voltage,
wherein the header switch corresponds to a set of back end of line (BEOL) devices, the first set of devices correspond to a first set of front end of line (FEOL) devices, and the second set of devices correspond to a second set of FEOL devices.

11. The integrated circuit of claim 10, further comprising:
a first conductive line extending in at least the first direction or the second direction, and being coupled to the first supply voltage and a source region of the header switch;

a second conductive line extending in at least the first direction or the second direction, and being coupled to at least a drain region of the header switch;

a third conductive line extending in at least the first direction or the second direction, and being coupled to a reference supply voltage and at least the first set of devices; and a gate region of the header switch extending in at least the first direction and the second direction, the gate region being between the first conductive line and the second conductive line.

12. The integrated circuit of claim 10, further comprising:
a header control circuit adjacent to the first set of devices, coupled to the header switch, and configured to generate a control signal.

13. The integrated circuit of claim 10, wherein the header switch comprises:
a transistor comprising:
a gate being a portion of the second metal layer of the first set of metal layers, the gate being configured to receive a control signal from a control circuit;
a source coupled to the first supply voltage; and
a drain coupled to the first set of devices, and configured to provide the first supply voltage to the first set of devices.

14. The integrated circuit of claim 10, wherein
the first metal layer corresponds to a topmost metal layer; and
the second metal layer is adjacent to the topmost metal layer.

15. The integrated circuit of claim 10, wherein the set of metal layers include one or more layers including at least one material selected from the group consisting of Al, Cu, W, Ti, Ta, TiN, TaN, NiSi, CoSi, and mixtures thereof.

16. An integrated circuit comprising:
a first set of devices configured to operate on a first supply voltage, and being located on a first layer of the integrated circuit;
a set of metal layers above the first layer, the set of metal layers comprising:
a first metal layer extending in at least a first direction and a second direction different from the first direction; and
a second metal layer extending in at least the first direction and the second direction, and being above the first metal layer;
a header circuit above the first set of devices, at least a portion of the header circuit being positioned between the first metal layer and the second metal layer, the header circuit configured to be coupled to the first supply voltage, and configured to provide the first supply voltage to the first set of devices, and to receive a control signal;
a header control circuit located on the first layer and adjacent to the first set of devices, coupled to the header circuit, and configured to generate the control signal; and
a second set of devices configured to operate on the first supply voltage, being located on the first layer of the integrated circuit and being coupled to the first supply voltage,
wherein the first set of devices corresponds to a first set of front end of line (FEOL) devices, the second set of devices corresponds to a second set of FEOL devices, and the header circuit corresponds to a set of back end of line (BEOL) devices.

17. The integrated circuit of claim 16, wherein the header circuit comprises:
a transistor comprising:
a gate being a portion of the second metal layer of the set of metal layers, the gate being configured to receive the control signal from the header control circuit;
a source coupled to the first supply voltage; and
a drain coupled to the first set of devices by the set of metal layers, and being configured to provide the first supply voltage to the first set of devices.

18. The integrated circuit of claim 16, wherein
the first metal layer of the set of metal layers corresponds to a topmost metal layer; and
the second metal layer of the set of metal layers is adjacent to the topmost metal layer.

19. The integrated circuit of claim 16, wherein the set of metal layers include one or more layers including at least one material selected from the group consisting of Al, Cu, W, Ti, Ta, TiN, TaN, NiSi, CoSi, and mixtures thereof.

20. The integrated circuit of claim 19, further comprising:
one or more layers of a dielectric material, wherein the set of metal layers are embedded in the one or more layers of the dielectric material, and the one or more layers of the dielectric material includes at least one material selected from the group consisting of SiN, SiCN, and mixtures thereof.

* * * * *